US005973624A

United States Patent [19]

Miller et al.

[11] Patent Number: 5,973,624

[45] **Date of Patent: *Oct. 26, 1999**

[54] ELECTRONIC COMBINATION LOCK WITH HIGH SECURITY FEATURES

[75] Inventors: J. Clayton Miller, Nicholasville, Ky.; Michael P. Harvey, Las Vegas, Nev.

[73] Assignee: C & M Technology, Inc., Nicholasville, Ky.

[ * ] Notice: This patent is subject to a terminal disclaimer.

[21] Appl. No.: 08/964,237

[22] Filed: Nov. 4, 1997

Related U.S. Application Data

[60] Continuation of application No. 08/583,689, Jan. 5, 1996, abandoned, which is a division of application No. 08/236,010, May 2, 1994, Pat. No. 5,517,184, which is a continuation of application No. 07/999,753, Dec. 31, 1992, abandoned, which is a division of application No. 07/719,046, Jun. 21, 1991, abandoned.

[51] Int. Cl.[6] .................... H03M 11/00

[52] U.S. Cl. .................... 341/35; 340/825.32; 340/542; 340/825.31; 70/278

[58] Field of Search .................... 340/825.31, 825.32, 340/542, 543; 341/35; 70/277, 278, 332, 434

[56] References Cited

U.S. PATENT DOCUMENTS

| | | | |
|---|---|---|---|
| 3,024,452 | 3/1962 | Leonard | 340/274 |
| 3,097,327 | 7/1963 | Bloor et al. | 317/134 |
| 3,320,490 | 5/1967 | Beck et al. | 317/134 |
| 3,633,167 | 1/1972 | Hedin | 340/825.32 |
| 3,796,889 | 3/1974 | Fradkin et al. | 361/172 |
| 3,812,403 | 5/1974 | Gartner | 70/278 |
| 3,958,231 | 5/1976 | Hoffman | 340/274 C |
| 4,095,239 | 6/1978 | Gerry | 340/147 MD |
| 4,114,147 | 9/1978 | Hile | 340/528 |
| 4,379,245 | 4/1983 | Goldstein | 310/319 |
| 4,457,148 | 7/1984 | Johansson et al. | 70/278 |
| 4,502,048 | 2/1985 | Rehm | 340/825.31 |
| 4,684,945 | 8/1987 | Sanderford, Jr. | 70/278 |
| 4,759,062 | 7/1988 | Traub et al. | 380/23 |
| 5,021,776 | 6/1991 | Anderson et al. | 340/825.31 |
| 5,061,923 | 10/1991 | Miller et al. | 340/825.31 |
| 5,299,436 | 4/1994 | Spitzer | 70/58 |

FOREIGN PATENT DOCUMENTS

| | | |
|---|---|---|
| 21670 | 1/1981 | European Pat. Off. . |
| 361881 | 4/1990 | European Pat. Off. . |
| 53-31498 | 3/1978 | Japan . |
| 2202577 | 9/1988 | United Kingdom . |

OTHER PUBLICATIONS

"X–07: A Safe Lock that Operates Electronically", 2342 *Locksmith Ledger International*, No. 9 (Jul. 1991).

*Primary Examiner*—Michael Horabik
*Assistant Examiner*—Albert K. Wong
*Attorney, Agent, or Firm*—Wood, Herron & Evans, L.L.P.

[57] ABSTRACT

An electronic combination lock includes a combination lock having a dial with no markings thereon. Rotation of the dial drives a generator which produces electrical pulses. The voltage pulses serves as a power source for the electronics of the lock. The lock also includes a security feature to disable the lock if the combination dial is stopped between dial rotations for a period of time which indicates dialing by an automatic dialer.

22 Claims, 19 Drawing Sheets

ELECTRONIC COMBINATION LOCK WITH HIGH SECURITY FEATURES

This application is a continuation of application Ser. No. 08/583,689 filed Jan. 5, 1996, now abandoned, which is a division of application Ser. No. 08/236,010 filed May 2, 1994, now U.S. Pat. No. 5,517,184, which is a continuation of application Ser. No. 07/999,753 filed Dec. 31, 1992, now abandoned, which is a division of application Ser. No. 07/719,046, filed Jun. 21, 1991, now abandoned.

BACKGROUND OF THE INVENTION

Mechanical combination locks such as those found on safes, vaults, cabinets and other high security enclosures are well known and subject to a number of attacks, such as by drilling, manipulation, and operation by dialer controlled by a computer.

Recently an electronic combination lock for such enclosures has been invented which provides the opportunity to greatly increase the level of security afforded by the lock, while at the same time overcomes many of the shortcomings of the prior art mechanical locks.

A dial type combination lock relies on the rotation of a dial to positions represented by numbers on the dial to rotate mechanical elements within the lock, such that the wheels of the mechanism align to allow a bar to drop into the wheels and retract the lock bar or bolt, allowing the enclosure to be opened.

The electronic combination lock does not have the equivalent mechanical elements and, therefore, can not be attacked in the same manner. For example, the mechanical lock may be drilled to permit the insertion of an optical device into the lock mechanism to observe the positions of the wheels and thus their alignment which permits the opening of the enclosure without the knowledge of the combination.

The electronic lock cannot be drilled for a similar purpose since the electronic lock mechanism will not reveal the position of any element which would be helpful for the attacker to observe and which would give the attacker any information as to the steps need to unlock the device.

The mechanical lock has a fixed position of internal elements relative to the dial and thus may be observed with the movements of the dial repeated by the attacker, at a later time.

The electronic lock does not have a fixed dial to number position relation and thus observation of the movement of the dial is much more difficult if not impossible.

Dialers exist which may be attached to the knob of a dial on a combination lock and which dial combinations under the control of a computer. As each combination fails, the computer then continues to dial other combinations to eventually unlock the lock.

With a combination lock of the mechanical type and sufficient time, a dialer is particularly effective.

The electronic combination locks are dependent upon electronic pulses being generated to indicate to the electronic controls, that the dial is being rotated and in which direction. The pulses may be generated by conventional pulse generation means when a voltage supply is provided to power the pulse generator.

Alternatively, pulses may be generated by the operation of the lock and the the voltage pulses provide a power source for the operation of the lock.

This type of power source eliminates the need for a separate power source for the system, such as a battery or other external voltage supply.

With the control of the device by a series of voltage pulses, the use of the pulses may be used to further control functions of the lock.

SUMMARY OF THE INVENTION

The electronic combination lock disclosed and described herein is a combination lock having a dial which has no di visions or markings relating to the numbers of the combination thereon. The rotation of the dial drives a generator which produces electrical pulses. The voltage pulses serve as a power source for the electronics of the lock and to further indicate to the microprocessor the speed and direction of rotation of the dial.

Through a random number generator, the micro processor generates a psuedo-random number which is then displayed on a display which is mounted in proximity to the dial.

The rotation of the dial of the lock is accomplished in a manner very closely related to the manner of the rotation of the dial of a conventional mechanical combination lock.

When the numbers of the combination have been entered through dial rotation, the microprocessor compares the combination with the authorized combination; if the same, a signal is sent to the motor that will engage the latch with the bolt retractor and connect the bolt through mechanical connections, to the dial so that when the dial is further rotated in the proper direction the bolt will be retracted and the enclosure is then opened.

The microprocessor is controlled by a coded program.

The ability to control the microprocessor with a microcoded control program is a major advantage in that the several functions and features may be added to make the lock mechanism and the enclosure more secure.

In order for a dialer to be effective, the relationship between the dial rotation and the numbers entered must be correllated so that a 3.6 degree rotation of the dial increments or decrements the entry number by one unit for a 100 unit dial. The generation of a random number within the microprocessor at the beginning of each number entry operation and the use of that random number as the starting point for the sequence of numbers displayed, eliminates the correllation of the number being displayed and eventually entered, and the dial position.

When the dial is rotated, the generator creates pulses and these pulses are received by and counted by the microprocessor. As the pulses are accumulated, the pulses are also timed and the speed of rotation of the dial is determined. As the speed of the rotation of the dial varies, the rate of change of the displayed numbers is changed. This is accomplished so that at a high rate of rotation the displayed numbers may change at a high rate while at the lower rates of rotation, the rate of change of the displayed numbers may be by single units at a slower rate with respect to the amount of dial rotation. Further the number of degrees the dial must be turned to effect the change of the displayed number will vary so that there is no consistent amount of rotation required to change the displayed number by one unit. This aspect of the lock also acts to foil the use of a computer controlled dialer.

The timing capabilities of the lock provides the opportunity to determine the time used in the entering of the combination. If the total time of entry is either too short, indicating that the lock is under attack by a device rather than a human hand, or if the time to enter the combination is too long, indicating that the operation of the lock is being attacked by other than a person having knowledge of an authorized combination, the lock is prevented from opening even if the authorized combination is subsequently entered.

As the connection between the dial and the generator is mechanical and, therefore, a predictable one, the number of pulses received by the microprocessor indicates the rotational displacement of the dial. The rotational movement of the dial by the hand of a human being is such that the dial is generally turned less than 360 degrees and then the dial is stopped while the operator releases the dial and acquires a new grasp of the dial. The stopping of the dial acts to allow a timer to run and if the stop period is less than a predetermined period that is related to human reaction time, the stop of the dial is not recognized as a stop of the dial. When the dial is rotated more than 480 degrees or 1.33 revolutions without a recognized stop, the lock is probably under attack by a device or at the very least by an unconventional dialing technique and the lock will not open even, if the authorized combination is entered.

Dialers are capable of reversing directions of the dial in very short times and depend upon speed to open a combination lock in a reasonably short time period without detection. This lock requires the dial be stopped or stationary for a short time periodically. One of those times occurs as the dial is reversed to enter the number just dialed and to start access to the next number to be entered. The timing of the stopped period of the dial insures both that a dialer is not being used and it extends the time that is necessary to open the lock by dialing all possible combinations until the lock is unlocked by the proper combination. If the dial is reversed in-less than the predetermined time period required to detect a stop of the dial, the microprocessor will not recognize the stop and the incrementing/decrementing of the numbers on the display will continue in whichever sense they were changing. This will foil the entry of a correct number and will set up a condition where the lock will refuse to open due to more than a 1.33 revolution of the dial without a stop.

The microprocessor will also keep a count record of all the failed attempts to open the lock since the last successful operation. If the numbers of trys or attempts to unlock the lock equals or exceeds the number set in the microprocessor microcode, the lock will fail to open even if an authorized combination is subsequently entered, prior to power down. After an error indication is displayed, the lock is disabled to prevent further entry tries, until power down and power up.

The self contained generation of power for the lock electronics and controls creates a major advantage since there is no need to provide a power source such as a battery. The life of an operational power charge is limited, without further rotation of the dial, and thus resets are not externally required. When a condition is created where the lock will not open even with the eventual entry of the authorized combination, the lock electronics must be reset. The reset is accomplished by letting the lock stand idle for a predetermined period of time without the dial rotation. Further rotation of the dial is ineffective to cause the lock to unlock. Waiting for the predetermined time out to reset the lock is a major deterrent to the success of a dialer which is dependent upon speed and non detection.

The timing capability of the electronic lock provides an opportunity to prevent the use of a practice common with mechanical locks. To access the safe or vault on a short notice, it is common to dial in the first two numbers of a combination and then to not enter the third number. When the operator is ready to access the vault or safe, the third and final number of the combination is entered and the enclosure is opened.

This common and dangerous security violation, which severely compromises the security of the enclosure, is overcome by the requiring of the complete entry of the combination within a preselected time period. The entry of two of three combination elements and the delayed entry of the third until after the relatively short time period has expired, causes the scrambling of the entered combination numbers and the lock requires the complete combination to be entered again.

The use of multiple combinations to open a lock is possible with this electronic lock even from a single lock mechanism. The mechanical lock mechanisms are not capable of multiple combinations being entered into a single lock. Accordingly multiple lock mechanisms are required for multiple combinations to be used to enter the enclosure. The present electronic lock accepts multiple combinations in what is referred to as a dual mode, requiring dual combinations. The combinations may be entered in any order, but if an error is made in either combination the lock will not signal that an error was made until after the second combination is entered, thereby not informing the attacker of the part of the procedure which was in error. The two combinations may be considered as a single 12 digit combination raising the security level of the lock, even though the combination is possessed by a single individual.

The lock may also be conditioned to accept the two separate combinations in a required order. The first combination required is referred to as the senior and the later combination the subordinate. When properly entered, the senior combination enables the lock to accept the subordinate combination at any later time. The repeated entry of the senior combination deactivates the lock such that it will not accept the subordinate combination until reactivated.

The electronic lock contains two counters that may be used for security monitoring. The first counter is an error counter which is incremented each time that the lock is unsucessfully operated. This count is retained in nonvolatile memory and the contents of the error counter displayed on the display at the time of power on, if greater than two. The authorized operator of the lock is shown an indication of the fact that the lock has been attacked and that the lock was not opened, since the number in the error counter is not reset until a proper combination is entered and the lock unlocked.

The second of the counters is referred to as the seal counter. The seal counter is incremented by one with each successful opening of the lock. It is never reset. With four digits, the maximum count is 9,999 and would require over 80 hours of dialing the correct combination to increment the count completely around to the number originally on the display prior to attack, if correct combinations were entered at the rate of two per minute. Thus by monitoring the the error and seal counters, the attack of the lock by an unauthorized individual is apparent and whether the lock was properly operated to access the enclosure is known to the authorized operator.

The combination of the lock may be changed if the combination is not known or forgotten, by using the serial number of the lock as a temporary combination. This allows locks that have been stored in inventory to be properly recombinationed by using the serial number of the lock, but does not allow one with the serial number of the lock but not the authorized combination to change the combination for later seemingly authorized access to the enclosure.

The invention described and claimed herein takes advantage of the electronic pulse control of the electronic lock and therefore it is an object of the invention to increase the security level of the lock.

Another object of the invention is to render the lock more resistant to the attack of the lock through attack by drilling or penatrating the lock mechanism housing for purposes of observation of the lock device.

An additional object of the invention is to render the lock safe from successful attack for a substantial period of time by use of a dialer device.

Another object of the invention is to disable the lock from becoming unlocked, when the conditions of the combination input are such that they fail to fall within preselected parameters to insure that the lock is not being attacked with a dialer.

It is a still additional object of the invention to render the lock inoperative when predetermined input parameters are not met and the failure of the parameters to be met suggests that the lock operation is by other than by a human being authorized to unlock the lick.

It is another object of the invention to prevent the lock from unlocking when the period of uninterrupted rotation of the dial of the electronic lock is in excess of a predetermined period.

It is another object of the invention of prevent the lock from unlocking when the amount of the dial rotation exceeds a predetermined amount, in a direction, without stopping the dial movement.

It is a still further object of the invention to prevent the lock from unlocking when the dial direction changes occur with such speed that the dial is probably not operated by the hand of a human being.

An additional object of the invention is that the lock will not operate to unlock if the dialing time exceeds a predetermined amount of time without either successful entry of the combination or the lock being powered down.

It is a another object of the invention to defeat the use of a dialer by varying the correlation between dial displacement and numerical incrementation, depending on the speed of rotation of the dial.

It is still an additional object of the invention to inhibit the use of a dialer by initiating all sequences of numbers displayed by the lock at a random number which has no relation to the last combination number element entered.

Another object of the invention is provide the ability to reverse and recover if a number is passed in the dialing, without having to restart the combination entry.

Still another object of the invention is to provide in a single combination lock the capability of requiring entry of multiple authorized combinations prior to the lock being unlocked.

An additional object of the invention is to provide to the operator of the lock a visual display of numbers that will indicate that the lock has been attacked and the number of times the lock has been successfully operated.

A still further object of the invention is to provide the capability of opening the lock and changing the combination of the lock, under controlled conditions, so that the combination of the lock may be changed or set when there is no record or recollection of the combination when the lock was stored.

The foregoing objects of the invention are accomplished by the electronic controls of the lock, as will become more apparent from the detailed description of the invention to follow.

The foregoing objects aspects and advantages of the invention will become apparent from the drawings and the detailed description of the invention that will follow.

DESCRIPTION OF THE DRAWINGS

FIGS. 16, 16A, 16B, 16C, 17, 18, 19, 20 and 21 are flow diagrams expanding operations illustrated in previous figures.

A more complete understanding of the invention may be acquired from the following detailed description of the invention that follows.

DETAILED DESCRIPTION OF THE PREFERRED EMBODIMENT OF THE INVENTION

Figure 1:
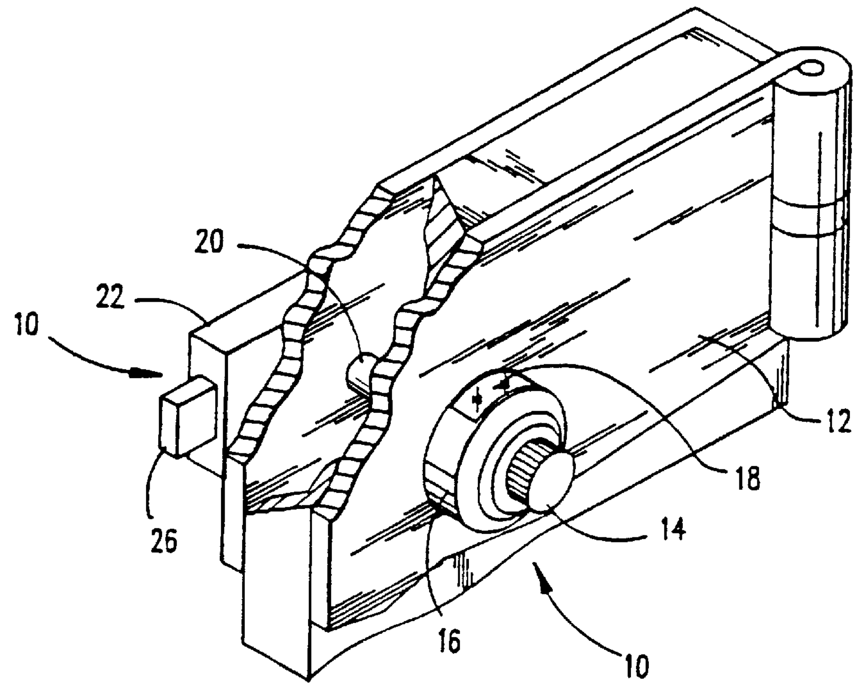
FIG. 1 shows the electronic lock positioned on the door of a safe or vault and shows the location of the display and the dial of the lock with no markings as are conventional on mechanical combination locks.

Referring to FIG. 1, the lock 10 in which the invention is embodied is shown mounted on a safe or vault door 12. The dial 14 is surrounded by a housing 16 which shrouds the periphery of the dial 14 and supports the display 18. If preferred, display 18 may be mounted separately from the dial 14. The dial is a Liquid Crystal Display (LCD) module, but could be any other low power consumption display device. The dial 14 is attached to a shaft 20 extending out the back of the dial mechanism, through the wall of the safe or vault door 12 and into housing 22 of the electronics 24 of the lock 10.

Extending from the housing 22 is a bolt 26 that is used to hold the door 12 shut when extended. Also contained in the housing 22 are the mechanical linkages and mechanisms which retract or extend the bolt 26 of the lock 10.

Figure 2:
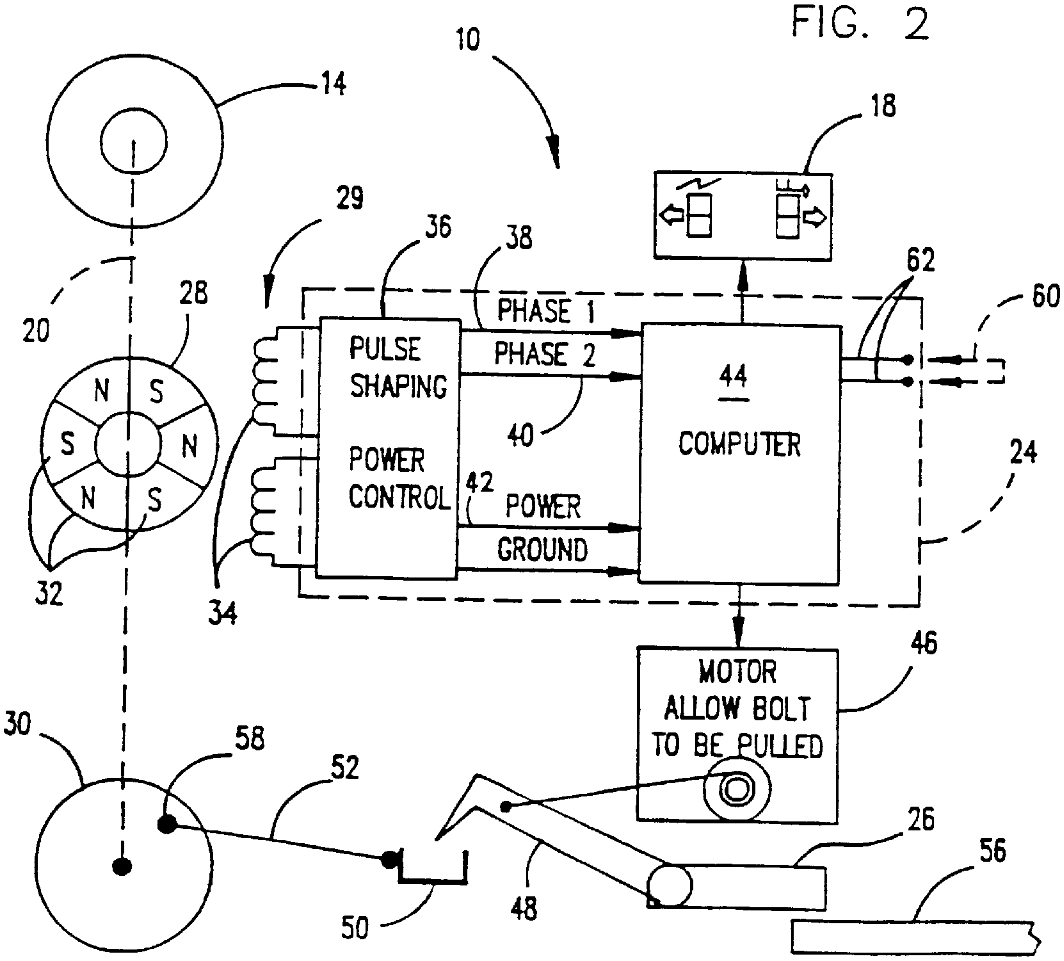
FIG. 2 is a schematic diagram of the lock and its associated electronics.

In FIG. 2, the dial 14 is connected to the rotor 28 and to the retractor drive 30. Rotor 28 is a segmented magnetic member having a plurality of magnetic segments 32. The number of magnet segments 32 on the rotor 28 is not critical and may selected to provide as many field direction changes as desired per revolution of the rotor. The magnetic fields of the magnetic segments 32 extend to and interact with the coils 34 which are placed in proximity to the rotor 28, to generate a pulse of electricity. The generator 29 may be a stepper motor driven as a generator. As the rotor 28 is rotated by the dial 14 and shaft 20, a series of pulses are generated which are fed to the power control and pulse shaping device 36. The shaping of the pulses is accomplished by circuitry that is conventional and forms no part of this invention. The pulses are then fed to the microprocessor 44 over the two phase lines 38 and 40. The pulses are out of phase so they may be used to determine the direction of the rotation of the rotor 28.

The power control and pulse shaping device 36 also charges an internal capacitor with the pulses of electricity generated by the rotor 28 and coils 34. The voltage of the capacitor is then supplied over the power line 42 to the microprocessor 44. The microprocessor 44 is powered for a limited time with the voltage, and the charge is stored in a capacitor within the power control 36. Powered time of the microprocessor 44 is dependent upon the capacitance of the capacitor and the current drain of the microprocessor 44 and display 18. The size of the capacitor is selected in coordination with the power requirements of the remainder of the system to provide power to the system for approximately 90 seconds after the dial 14 and the rotor 24 have ceased to rotate. This time period provides adequate time to open the lock 10 or to pause in the entry of the combination without losing the previously entered elements of the combination. On the other hand, the time period is long enough to provide a significant delay in the reset of the lock electronics 24 after the lock has become unopenable due to any of several conditions having occurred. This delay period is a significant factor to defeat the use of a dialer.

Microprocessor 44 provides outputs to a display 18. The display 18 is capable of displaying numerals of at least two digits and arrows pointing in opposite directions. Symbols such as a lightning bolt for a error symbol or a key symbol are used to indicate selection of the combination change mode.

The preferred display 18 is a Liquid Crystal Display or LCD device which has the advantage of being a relatively low consumer of electrical power. Low power consumption is a significant consideration since power generated by the rotation of the lock dial 14 is relatively small and must be stored within the components of the electronics of the power control and pulse shaping components 36 of the system.

The microprocessor 44 also has an output to the latch motor 46 which acts to connect the latch 48 of the lock 10 to the bolt retractor 50. The latch 48 is an arm which when engaged with the bolt retractor 50 may be pulled or pushed by the bolt retractor 50, when it is moved. A small rotary motor 46 for moving the latch 48 is preferred. The latch 48 is constrained by the lock housing 22 in FIG. 1, for sliding movement and is extended or retracted as necessary to lock or unlock the enclosure 56.

Bolt retractor 50 is engaged with the retractor drive 30 by the link 52. The link 52 converts the movement of the retractor drive 30 and engaging point 58 into a linear movement of the bolt retractor 50.

The microprocessor 44 may be any suitable microprocessor manufactured and sold on the market. However the preferred embodiment of the invention includes a microprocessor designated 80C51F and manufactured and sold by Oki Electric Industries Company, Ltd, of Tokyo, Japan.

Figure 3A:
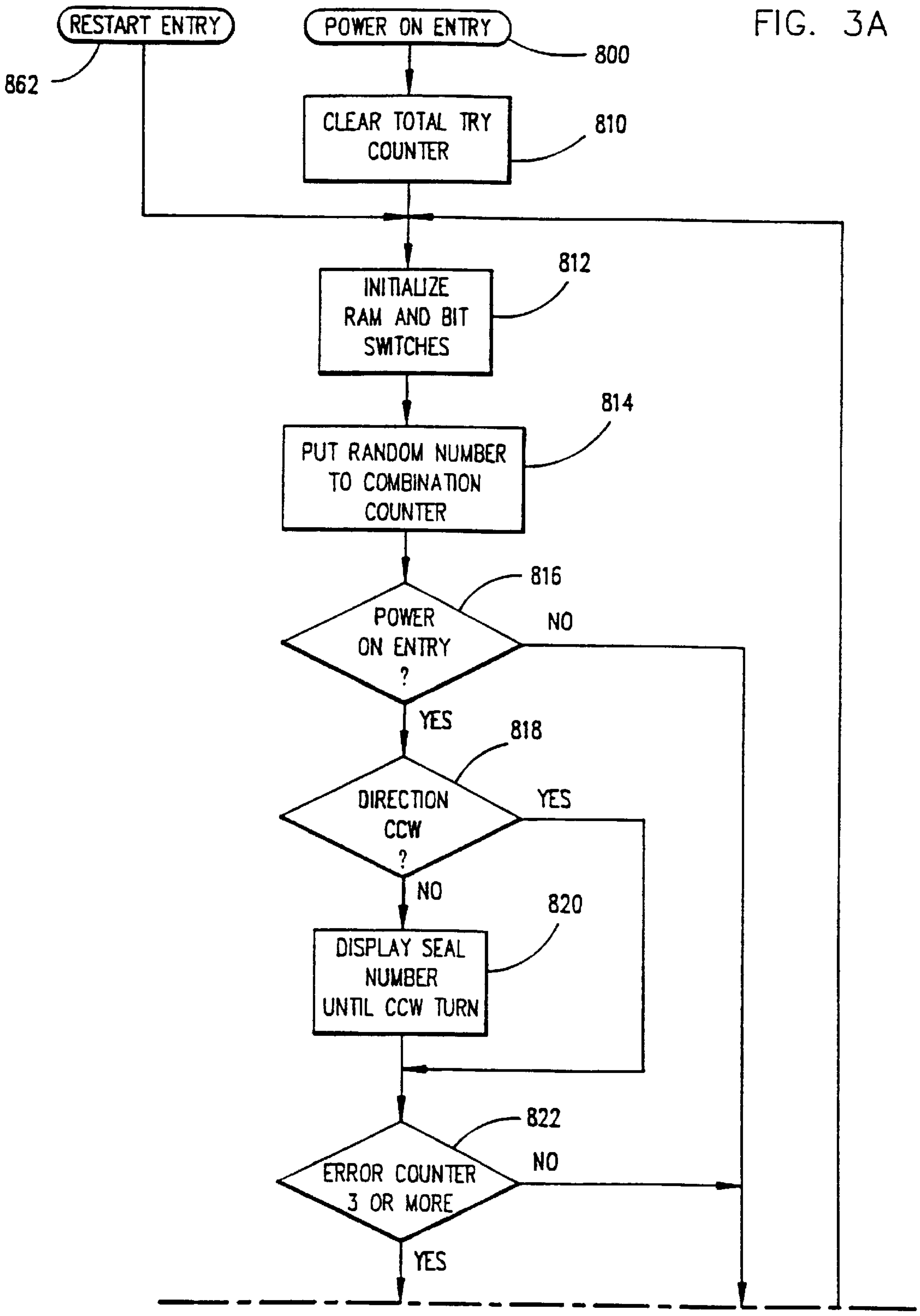
FIGS. 3A and 3B are flow diagrams of the logic control of the microprocessor of the electronic lock, showing the overall operation and control of the lock.
Figures 3, 3B:
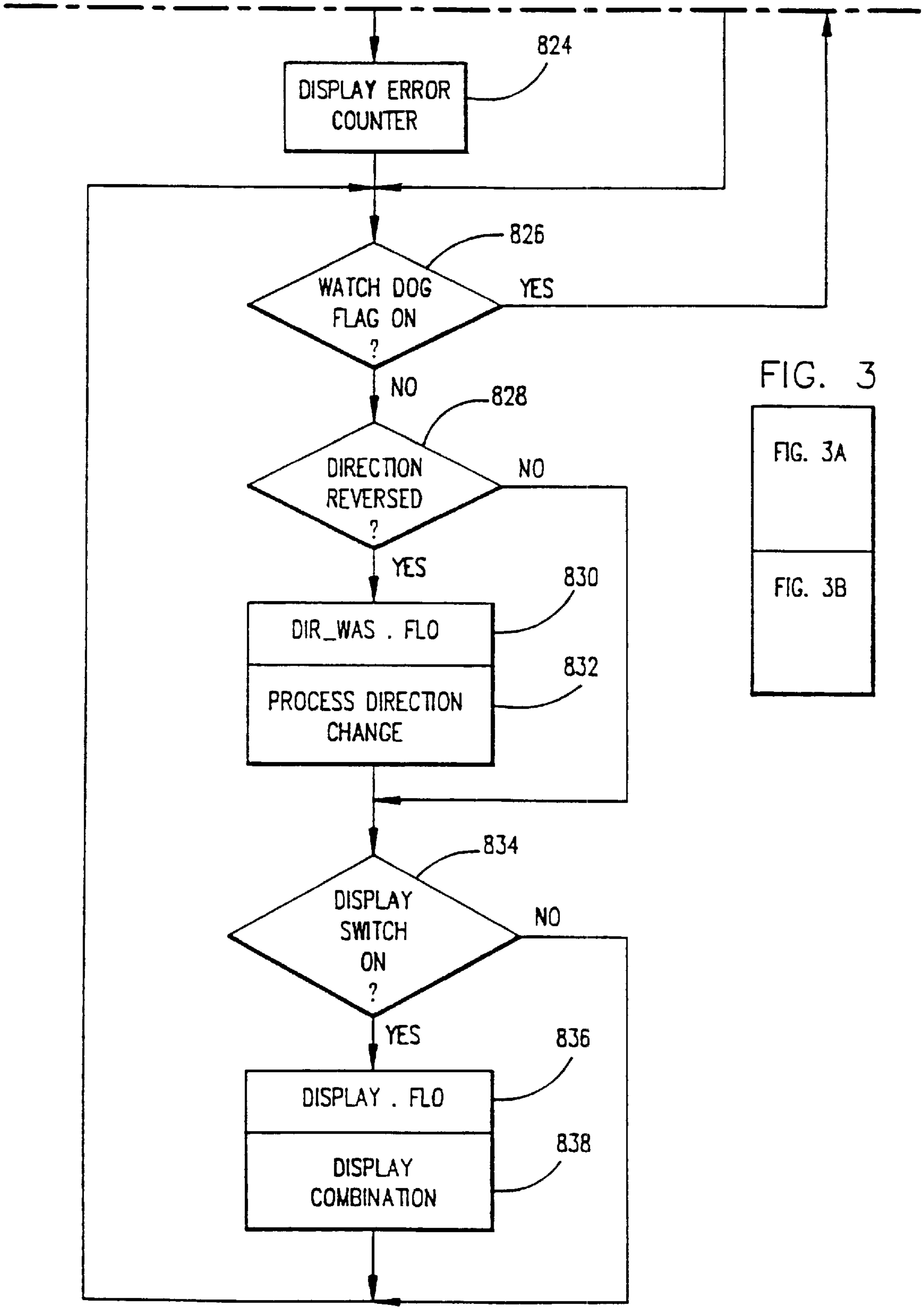

The operation of the microprocessor is represented by the flow diagram of FIG. 3. The following description will explain the microprocessor 44 logic operations and flow as the lock 10 is operated.

MICROPROCESSOR OPERATION AND CONTROL

Referring to FIG. 3, the system begins functioning when the generator 29 provides sustaining power to the electronic logic or microprocessor 44. This is represented by operation 800.

When the power is sufficient, the first function of the system is to clear the total try counter in operation 810. This permits the opening of the lock 10 with the authorized combination even if the lock 10 had been disabled due to a sufficient number of erroneous combination entries to prevent the lock from opening.

Thereafter, the Random Access Memory (RAM), within the microprocessor 44 is initialized and all bit switches or flags are reset to their default conditions, in operation 812. This conditions the system to accept inputs from the dial 14 of the lock 10.

The random number generator of the microprocessor 44, in operation 814, generates a random number between 00 and 99 and loads the number into the combination counter. This provides the system with a starting point for the electronics to work from in the accepting of combination element entry.

In operation 816, a determination is made as to whether this operation is the result of a power on entry into the system or a restart entry into the system. If this operational sequence of the system is due to power on, the flow is to operation operation 818 where the direction of the dial 14 determined from the phase relation of the pulses. If the dial 14 is being rotated in the counterclockwise direction, the flow branches to operation 822. However, if the rotation of the dial 14 is clockwise, then the seal counter number is displayed, in operation 820, until the dial 14 is turned counterclockwise.

The flow from operations 818 and 820 both converge on operation 822 where it is ascertained if the error counter contains a count greater than 2. If not, the flow branches to operation 826. If the error counter contains a count of 3 or more, the flow is to operation 824 where the number is displayed on display 18. The operator is shown the number of unsuccessful attempts made to open the lock since the last successful entry attempt.

Thereafter the flow is to operation 826. In this operation there is a decision as to whether the watch dog flag is set. The watch dog flag, when set indicates whether the lock has been left with the dial unmoved or the dial has not stopped for more than 40 seconds. If the flag is set, then the flow branches back to just prior to operation 812 where the lock is reinitialized and the lock conditioned to be opened with a new combination entry attempt.

Figure 4:
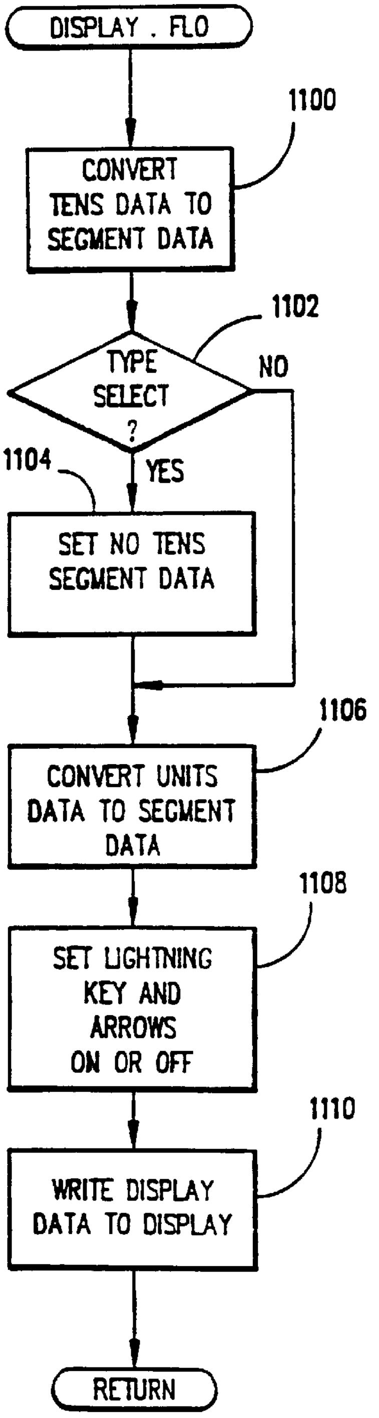
FIG. 4 is a logic flow diagram representing the logic and operations to display numbers and symbols on the display.
Figure 16A:
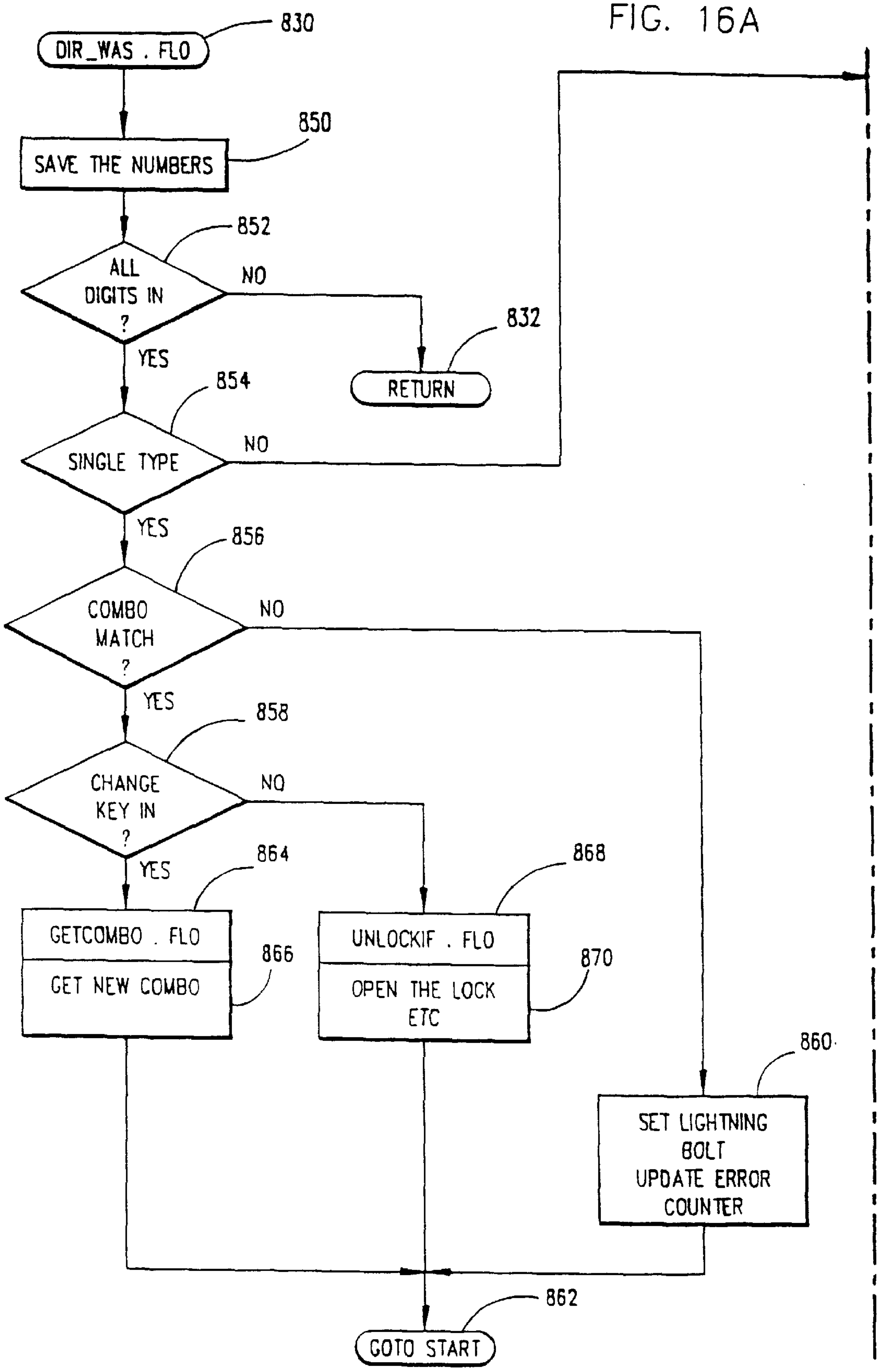
Figure 16B:
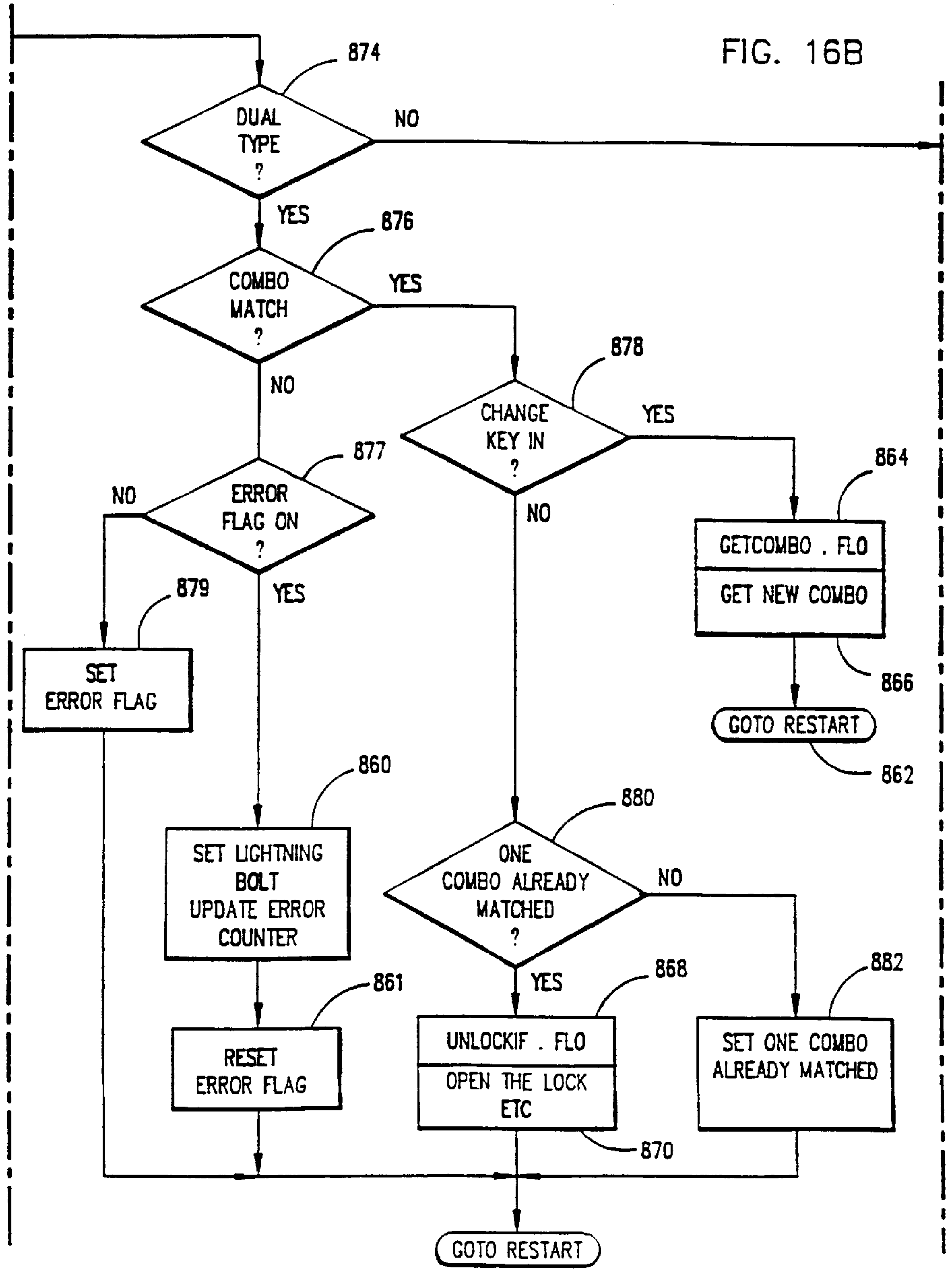
Figure 16C:
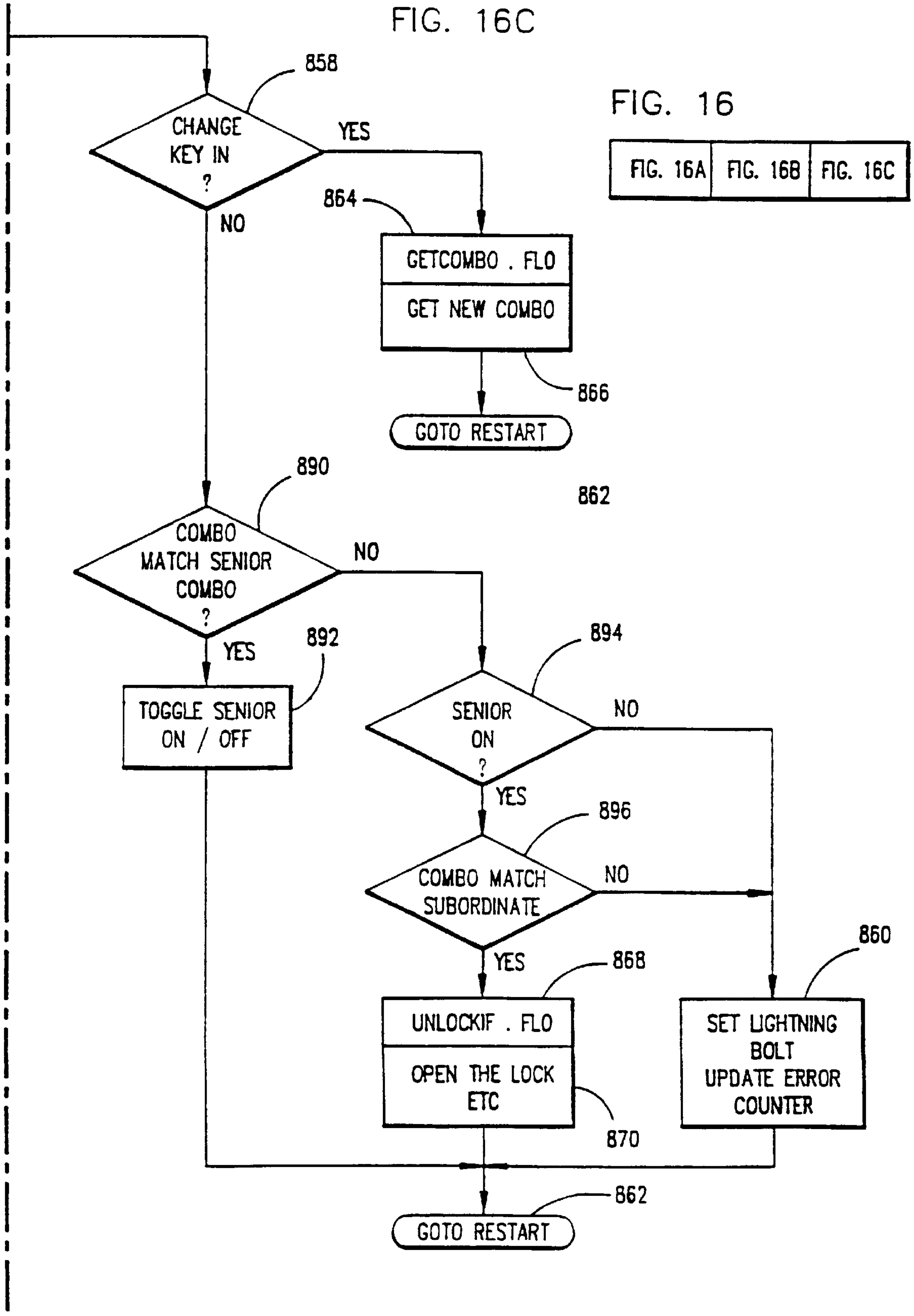

When the watch dog flag is not set, operation 828 will determine if the dial 14 has been reversed and if so the flow is block 830 which represents the subroutine shown in FIG. 16. Following rentry to the main system flow from FIG. 16, the direction change is processed in operation 832 and a check is made in operation 834 as whether the display switch or bit is set ON. If the determination in operation 834 is true, then the subroutine in FIG. 4 is entered and completed and the combination is then displayed in operation 838. When the display bit or switch is not on, then the flow branches back to the just prior to and reenters operation 826.

Referring to FIG. 16, Block 830 represents entry into the subroutine, and the numbers in the combination counter are saved as an element of the combination in operation 850. Thereafter the decision is made in operation 852 as whether all elements of the combination have been entered. If not, the flow returns to the main system flow and reenters at operation 832.

If all the numbers for the combination have been entered, then there is a determination at operation 854 as to whether the operation of the lock is conditioned for single combination operation; and if true, the combination is compared with the stored authorized combination in operation 856. If on the other hand the lock is not conditioned for single combination operation, the flow branches at operation 854.

Figure 15:
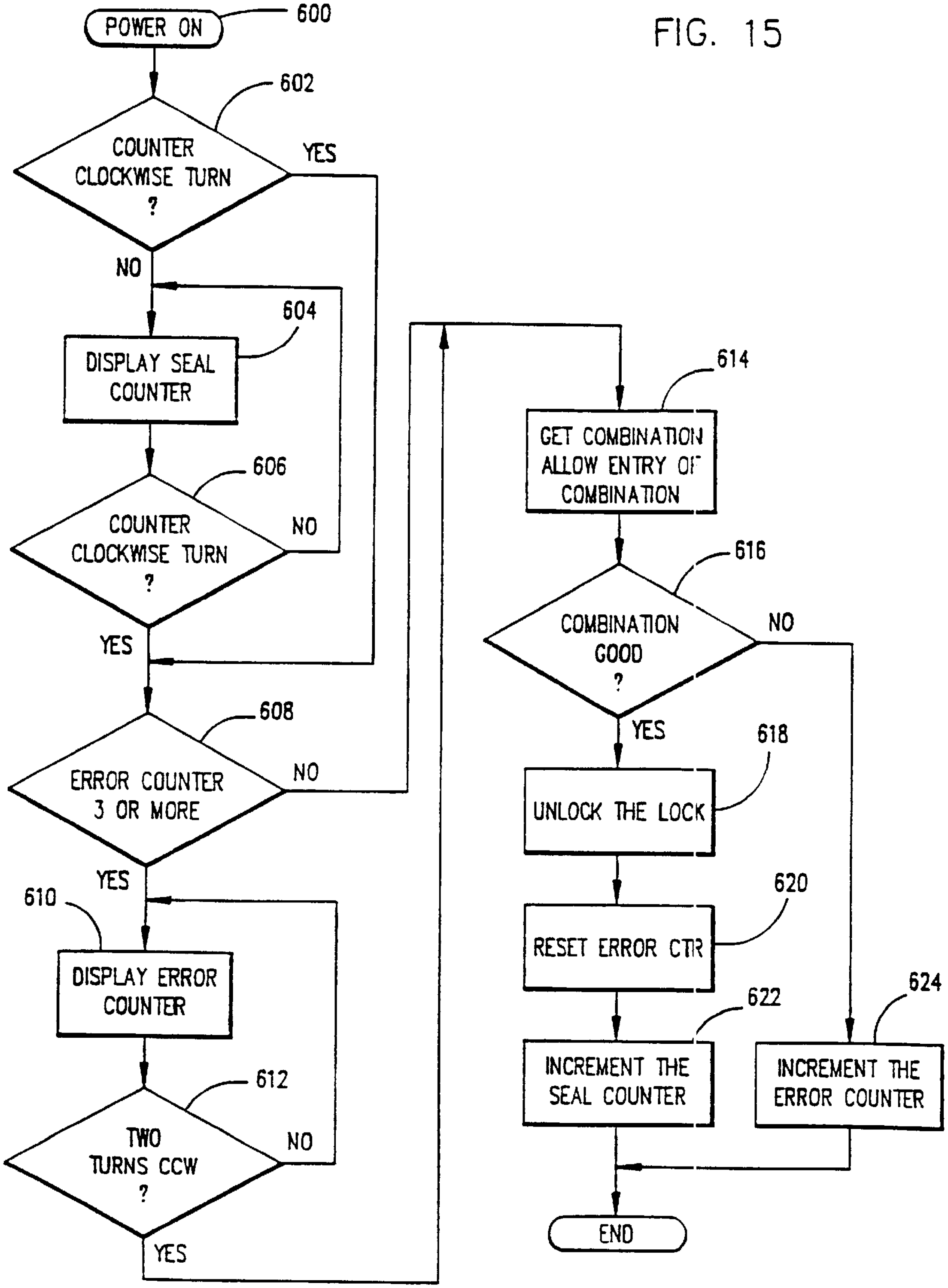
FIG. 15 is a logic flow diagram illustrating the logic and operations which control the use of and displaying of the contents of the error and seal counters.

If at operation 856, the combination does not match then the error signal is set and the error counter is updated by incrementation by one, in operation 860, and then the flow is to the restart entry point 862 in FIG. 15.

Referring back to FIG. 16, if the combination matches in operation 856, the ports 62 of microprocessor 44 are checked to see of the change key 60 has been inserted. If the change key 60 has been inserted into the ports 62, then the flow is to block 864 which represents the subroutine shown in FIG. 17. Upon completion of the routine of FIG. 17, the flow returns to operation 866 where the new combination is gotten and confirmed and used thereafter as the authorized combination, in operation 866. Then the flow is directed to the restart entry point in FIG. 15, operation 862.

Figure 18:
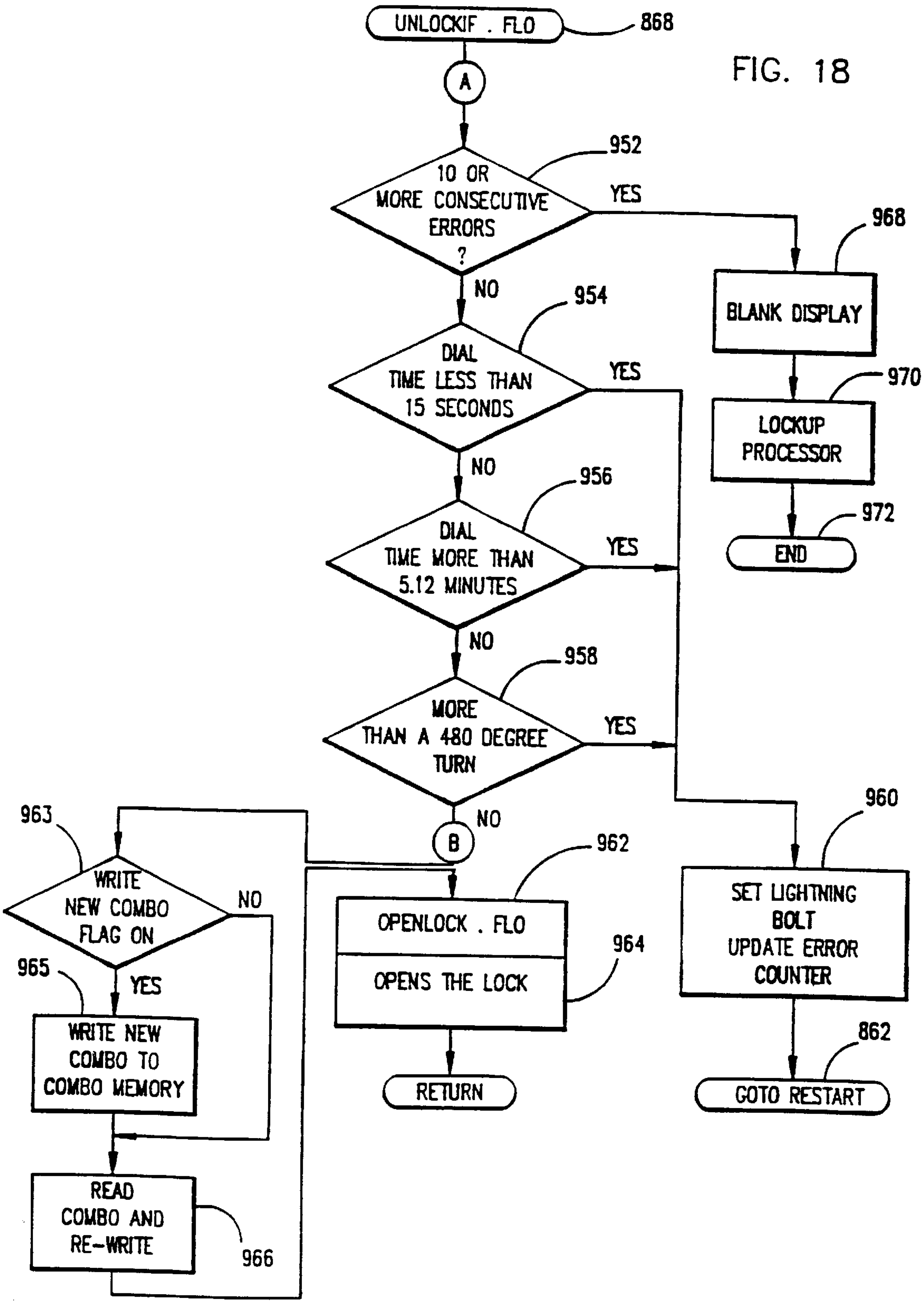

If the change key 60 has not been inserted, then the flow at operation 858 branches to the subroutine in FIG. 18 as represented by block 868 and upon completion of the routine in FIG. 18, the lock is opened in operation 870. Thereafter, the flow is to restart entry 862 in FIG. 15 to await any further action.

Figure 17:
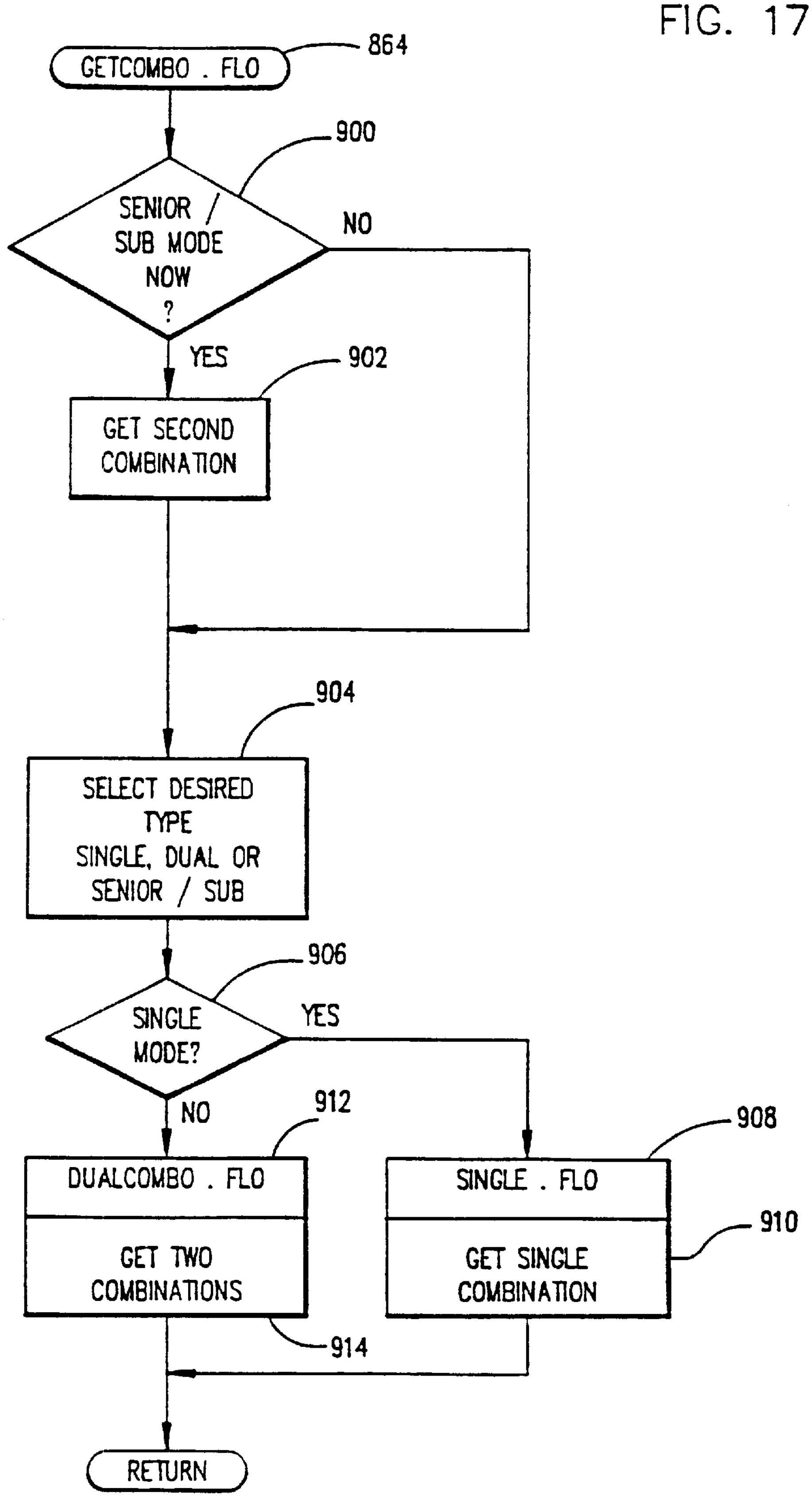

Referring first to FIG. 17, the condition of the lock is checked to see if a second combination is required to open the lock, in operation 900. If not the flow branches around operation 902, to operation 904. If a second combination is required to open the lock, then the second combination is gotten in operation 902, from the dial input.

Figure 19:
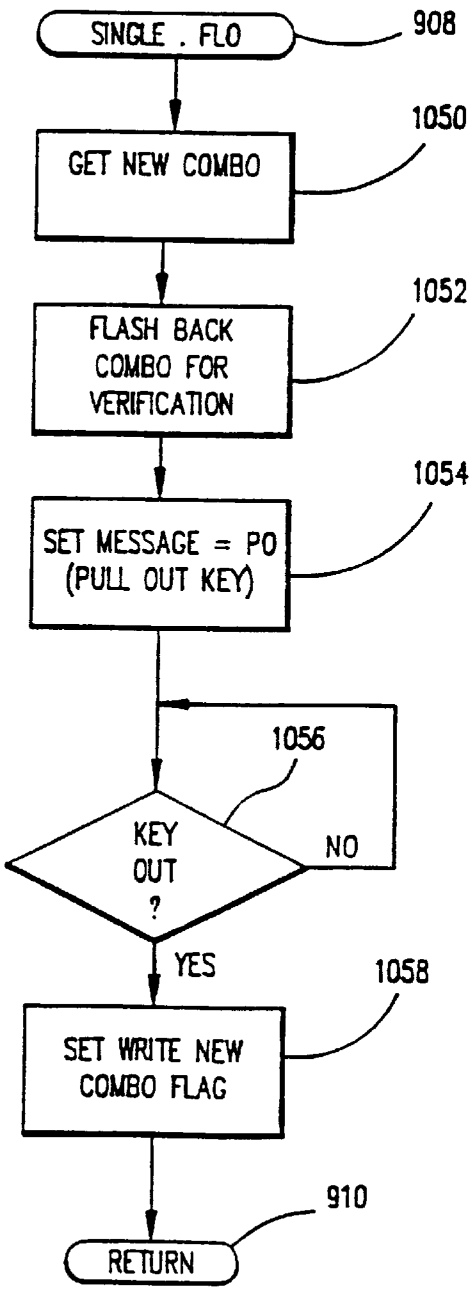

In operation 904, the type of operation is selected such as single, dual or senior/subordinate operation. In operation 906 if the determination is that it is a single combination mode of operation, the flow is to operation 908 which represents the subroutine shown in FIG. 19; when the routine in FIG. 19 is complete, the flow will return to Block 910 where the single combination is acquired for the dialing procedure.

Figure 20:
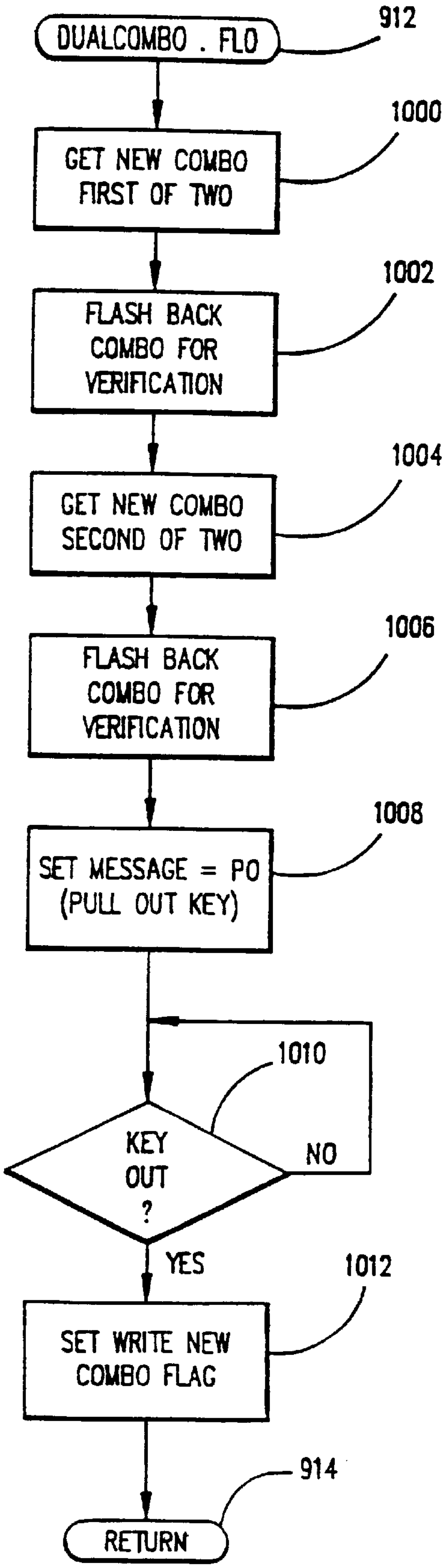

If the determination at operation 906 is that the lock is operating in a mode other that a single mode, the flow is to block 912 which represents the subroutine of FIG. 20; and when that subroutine is complete, the flow is back to operation 914 where the operation receives two combinations and thence to the main routine in FIG. 16 at operation 866.

Referring to FIG. 16, block 868 represents the subroutine shown in FIG. 18. In FIG. 18, the error counter is checked, in operation 952 to determine if the count is greater than 9 and if the number is greater than 9 the flow is to operation 968 where the display is blanked and to operation 970 where the microprocessor 44 is locked up or disabled. The routine then ends at operation 970. The electronics 24 must then power down prior to reinitiation of operation at power on entry at 800 in FIG. 3.

When the error counter is 9 or less then the time of entry of the combination is checked; if less than 15 seconds, the flow is to operation 960. If the dialing time to enter the combination is greater than 15 seconds, then the flow is to operation 956 where the total time of dialing is ascertained and compared to 5.12 seconds. If the time is greater than 5.12 seconds, then the flow is operation 960, and if less, then to operation 958 where the amount of dial rotation without a stop is compared to 480 degrees. If more than the 480 degrees, the flow is to operation 960. If less than the predetermined 480 degrees, then the write new combination flag is checked at 963 and if ON then the new combination is written to memory in operation 965. Thereafter, the combination is read and rewitten to combination memory in operation 966 and the flow continues to 962.

Figure 21:
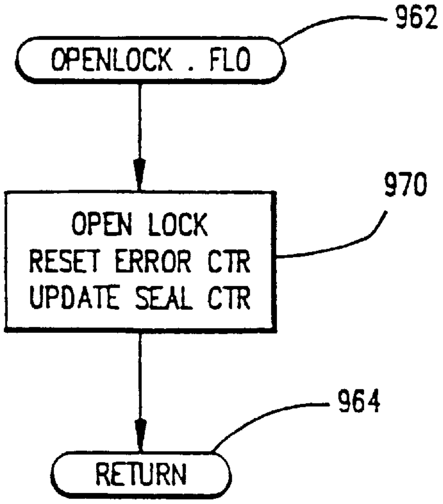

Then the open lock subroutine of FIG. 21 is accessed in block 962, with the flow returning to operation 964 which opens the lock. Thereafter the flow returns to operation 870.

Referring to FIG. 21, in operation 970, the lock is opened and the error counter is reset, as the contents of the error counter is representative of unsuccessful attempts to open the lock 10 following the last successful operation. Further, the seal counter is updated by incrementing its contents by one to reflect the latest successful entry. Then the flow returns to operation 964.

DUAL AND SENIOR/SUBORDINATE COMBINATION FEATURE

Referring to FIG. 16, operation 854, if the lock 10 requires more than one combination to unlock the lock 10, then the flow branches to Operation 874 where it is determined if the lock is a dual combination type operation. When the operation is a dual combination type operation the combination match is checked in operation 876 and if the combination does not match either authorized combination, the the error flag is checked at 877 and if ON the error signal is activated, the lightning bolt is displayed in operation 860 and the error counter updated. The error flag is then reset at 861.

Should the error flag be OFF in operation 877, the the error flag is set 879. The flow from operations 879 and 861 is to restart entry 862.

When the combination matches, the ports 62 of the microprocessor or logic control device 44 are checked to see if the change key 60 is inserted. If not, the decision is made in operation 880 as to whether one combination has already matched and, if so, the flow is to the subroutine in FIG. 18. and then back to operation 870, previously described. If operation 880 determines that no previous combination has been matched, then a flag is set in operation 882 to indicate that one combination has been matched. Then the flow is from operation 870 or 882 back to the restart entry point 862.

Referring to operation 874, if the lock is not conditioned to open in response to a dual combination entry, then the flow branches to operation 858, previously described and if the key 60 is inserted then to block 864 and 866 and then to restart entry 862, all previously described.

If the change key 60 is not inserted into the ports 62, the combination is compared in operation 890 to the senior combination and if matched, then the senior combination flag is toggled on/off in operation 892. This either enables the subordinate combination or disables the acceptance of the subordinate combination respectively.

When the combination does not match the senior combination in operation 890, operation 894 checks to see if the senior flag is set ON and, if so, the combination is checked against the subordinate combination in operation 896. If either of the operations 894 or 896 test not true, then the flow from the respective operations is to operation 860 which has been previously described.

When the combination matches the subordinate combination in operation 896, the flow is to block 868 which represents the subroutine in FIG. 18, which has been previously described, together with operation 870. The flow from operations 860 or 870 is to restart entry 862 in FIG. 15.

Referring to FIG. 17, block 912 represents the subroutine illustrated in FIG. 20. Upon entry to the subroutine in FIG. 20 the new combination is acquired or read from the dialing operation as the first of two combinations, in operation 1000. Then in operation 1002, the combination is flashed back to the operator, permitting the operator to observe the combination that has been entered and changed. After the the combination has been flashed back to the operator for several sequences, the logic control will flow to operation 1004 where the new combination, the second of two, is read from the dialing operation; the new, second combination is flashed back to the operator for verification. After the the flashing ceases, as in operation 1002, the message "PO", standing for Pull Out is displayed on the display 18 to tell the operator to pull the change key 60 from ports 62. At this point, in FIGS. 19 and 20 at operations 1058 and 1012 respectively, the change key symbol is turned off and a message "CC" is displayed to prompt the operator to confirm the combination(s) by entering the new combinations (s). Thence, the bolt 26 is retracted and the new combination (s) are stored in combination memory, completing the change of combination operation.

After the message "PO" is displayed, operation 1010 will continue to sample the ports 62 to determine whether the change key 60 has been removed. The looping and sampling will continue until the key 60 is confirmed as removed, whereupon, in operation 1012, the write new combination flag is set and the flow returns to the flow in FIG. 17 at operation 914.

Referring again to FIG. 17, Block 908 represents the subroutine illustrated in FIG. 19. Thus block 908 is expanded into a subroutine and when the subroutine in FIG. 19 is complete, the flow returns to operation 910 of FIG. 17.

In FIG. 19, the flow enters the subroutine at 908 from FIG. 17 and the new combination is read or retrieved from the combination memory in operation 1050.

To allow operator verification, once the combination has been retrieved, it is flashed back on the display 18 to the operator. After the combination has been displayed to the operator, operation 1054 signals a message "PO" to the operator prompting the operator to Pull Out the change key 60 from the ports 62.

The electronic control of the lock then attempts to verify in operation 1056 that the change key 60 has been removed for ports 62, signifying the completion of the combination change; if the key 60 has not been removed, the logic operations continues to verify until such time as the key 60 is removed. Only when the key 60 has been removed, will the control logic flow progress to operation 1058 where the the new combination flag is written into memory. Thereafter the flow returns to operation 910 in FIG. 17.

Block 836 of FIG. 3 is further expanded in FIG. 4. Referring to FIG. 4, the flow enters at block 826 and then converts the tens data to segment data. The display 18 is of the type where the numbers displayed are made up of segments that are turned on or turned off and the ones turned on in conduction with the others turned off form contrasting bars against the background of the display, making visible numbers. This operation 1100 converts, thru a table look up, the number in the tens position of the display, to data bits, ones and zeros, necessary to turn on or off the segments of the display in the tens position.

Next a check in operation 1102 is made to acertain if the display is displaying a combination number or a number which represents the mode of the lock 10. The mode of the lock is set, to condition the lock 10 to be opened with one combination, a minimum of two combinations or a combination which must be entered before any second combination is entered, known as the senior/subordinate mode. When the display 18 is responding to the operation of the lock 10 to indicate what mode it is to operate in, the display 18 is displaying a single units digit and no zero in the tens position. During this phase of the lock 10 operation, operation 1102 will pass the flow to operation 1104 where the segment data for the tens position of the display 18 will not be set. When the lock 10 is in its normal operational mode of accepting combination input, the flow is through the NO path from operation 1102 around operation 1104, to operation 1106 where the units data is converted to segment data in the same manner as the conversion in operation 1100. Then the lightning bolt, key and left and right arrows are set ON or OFF as appropriate.

After the conditions are set, the display data is written to the display 18 to cause the display to show the appropriate symbols, in operation 1110. Thereafter the flow returns to operation 828.

With this understanding of the operation and control of the microprocessor, the operation of the microprocessor will be described with respect to the several security features.

RANDOM NUMBER START

As the dial 14 of the lock 10 is rotated and pulses from the generator 29 are shaped and transmitted to the microprocessor 44, data is generated and passed as input to the microprocessor to input combination numbers to the system. On mechanical combination locks the dial has on its periphery marks and numbers that the operator must align with a guide mark to properly position the wheels in the lock. With this invention, not only are there no such marks or numbers, but the electronics 24 must generate the signals representing the numbers which activate the LCD device to display numbers for observation by the operator. If the first number displayed at the beginning of a movement of the dial 14 to increment or decrement the numbers displayed, were in some relation to earlier numbers entered into the lock or were consistently the same, a dialer could be programmed to account for that datum point. Only one unsuccessful attempt to open the lock 10 would be necessary for the attacker to ascertain the relationship. In the instant invention, the microprocessor 44 has included within its capabilities the ability to generate psuedo random numbers between 00 and 99. The random number generated is displayed and used as a base point or datum point from which to start that sequence to enter a number of the combination.

Referring to FIG. 3A, at block 814 the random number generator of the microprocessor 44 generates or picks a number between 00 and 99 inclusive in operation 102. This number is entered into the combination counter of the microprocessor 44 and displayed on the display 18.

As the dial 14 of the lock 10 is rotated, the generator 29 provides a pulse train with one pulse corresponding to the rotation of the dial 14 by an amount of choice, typically one pulse for each three degrees of rotation. The generator may be a permanent magnet stepper motor and the resolution of the motor steps will dictate the number of steps per revolution and thus the resolution of pulses for any amount of rotation.

Figure 13:
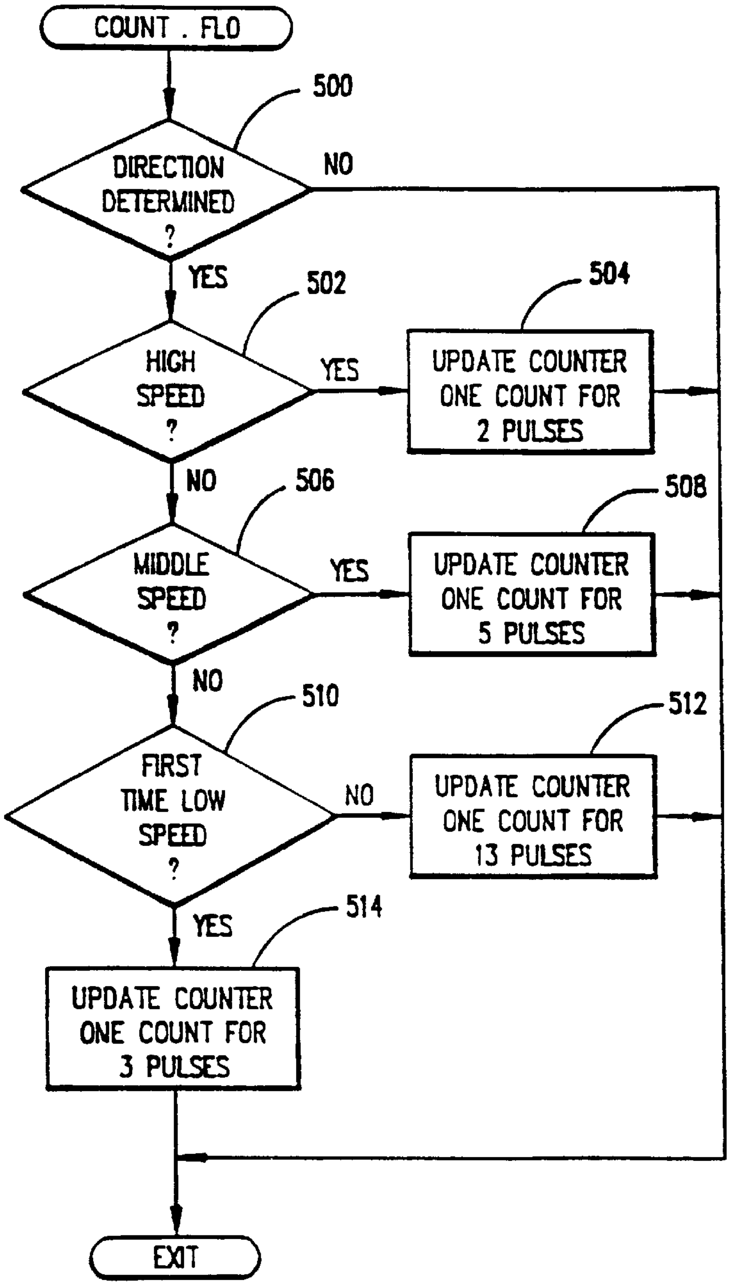
FIGS. 12 and 13 are logic flow diagrams that illustrates the logic control operations of the microprocessor to convert the speed of the dial rotation into a rate of incrementation of the displayed number.

The pulses are then counted and the microprocessor 44 determines the number of pulses necessary for the microprocessor 44 to increment or decrement the number on the display 18 by one and increments or decrements the displayed number by one, as will be explained with respect to FIG. 13. The flow in FIG. 13 and subordinate routines control directin and other facits of the operation.

From the foregoing, it can be seen that the random number generator of the microprocessor 44 will start each number entry sequence at a random number which will in all probability not be the same as that of any other sequence in the lock opening operation. This prevents the dialer from being able to increment the numbers entered in an up or down direction, from a known starting point. This severely restricts the use of a dialer. This feature of the operation of the lock significantly improves the security of the lock by defeating one significant method of surrepticious attack on the lock 10.

FAST ENTRY LOCK OUT

Since the main purpose of a dialer is to attack a combination lock by very rapid dialing of all the combinations necessary to open the lock, it is desirable to slow down the entry of lock combinations. By slowing the acceptable entry of a combination, it insures that the lock will statistically withstand such an assault for a longer time. If a dialer were devised to overcome some or all of the other safeguards and features of the lock, slowing the acceptable entry rate will reduce the number of entries that may be attempted in a given period of time. Since time is an enemy of the attacker, and exposes them to detection over longer time periods, anything that will delay the attackers success is of great importance.

Figure 5:
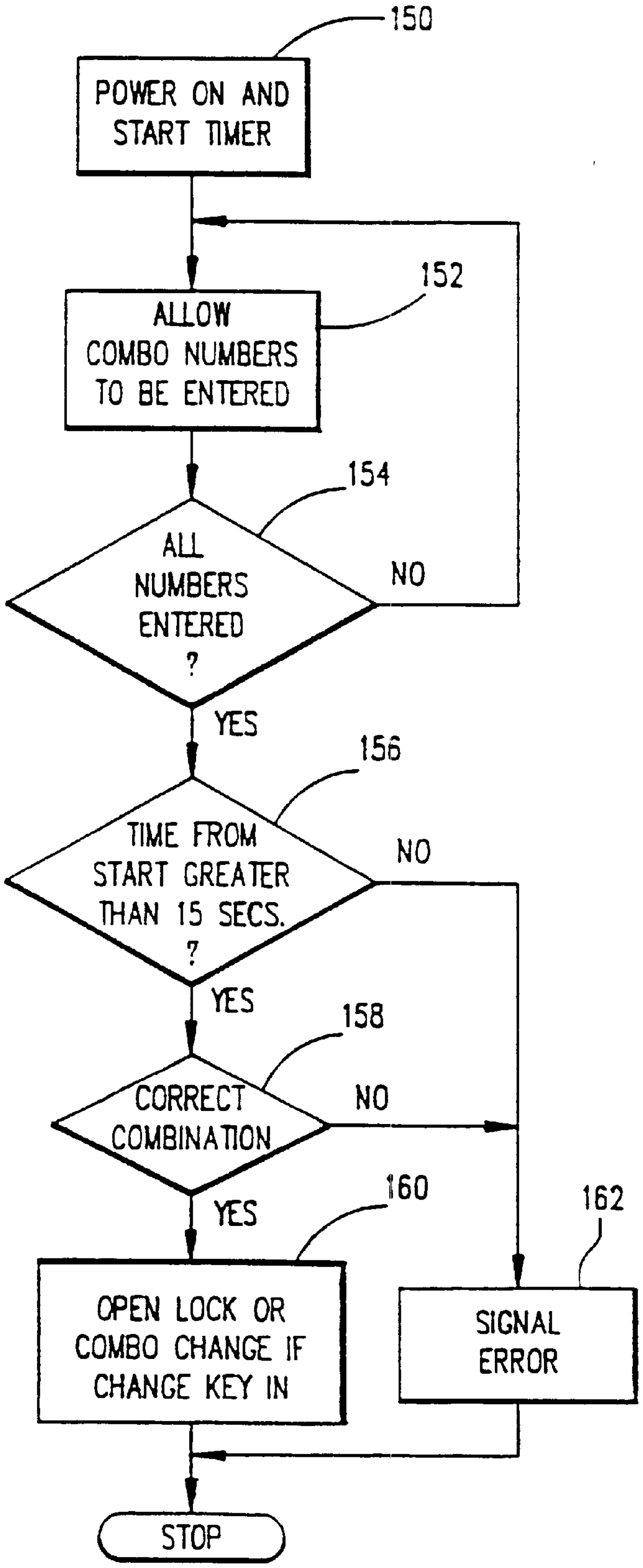
FIG. 5 is a logic flow diagram showing the logic operations that prevent the lock from opening if the combination is entered correctly, but in less than a predetermined amount of time.

Accordingly, the electronic lock 10 is provided with a timer within the microprocessor 44 which times the period from power-on until the entry of the last number of the combination. The logic flow diagram of FIG. 5 illustrates the flow for this security enhancing feature of the lock 10. FIG. 5 is an expansion of Operation 954 of FIG. 18.

The internal clock timer of the microprocessor 44 is started at power-on when the microprocessor 44 is supplied sufficient power from the pulse shaping and power control 36 to operate the electronics 24 as represented in block 150. The lock electronics 24 will then accept the entry of the combination numbers normally, as illustrated in block 152. In decision block 154, the condition is tested as whether all numbers of the combination have been entered; and if found to be false, then the flow loops back to just prior to operation 152 which allows the next combination number to be entered. When the condition tested in operation 154 is satisfied, the loop is exited and the flow is to operation 156 where the time from the start of operation, is contained in the timer that was started in operation 150, is tested to determine if the elapsed time has been greater than a predetermined time period. For example, the time period may be selected to be 15 seconds, since a human being operating the lock dial 14 will take longer than 15 seconds to enter the combination, normally. Thus it may be safely assumed that any entry in less than 15 seconds is an attempt to attack the lock with a very rapid non-human device such as a dialer.

If the time is less than 15 seconds, then the flow branches to operation 162 where a signal is displayed indicating an error. The symbol of the preferred embodiment is a lightning bolt. After the error is signalled, the lock logic flow returns to the main system flow and the lock will not open until a correct combination is entered and the entry time is greater than 15 seconds.

If the time period is determined to be greater than 15 seconds, in operation 156, then the flow is to operation 158 where the combination is tested or compared with the correct combination of the lock 10 by the microprocessor 44; if not correct, the error signal is displayed in operation 162.

If the combination is found to be correct in operation 158, the lock is opened or a change of combination is effected, in operation 160, when the change key 60 is inserted in the change key ports 62 of the microprocessor 44. Use of the change key 60 will be discussed in more detail below.

The testing and signaling of an error when the combination is too rapidly entered acts to defeat the operation of a dialer. Accordingly, the selection of a minimum time which must be exceeded in the entry of a combination enhances the security of the lock 10.

MAXIMUM ENTRY TIME FEATURE

If the lock is dialed by an attacker and the correct combination is not entered in a period of time that is preselected, such as for example, 5.12 minutes, then it is assummed that the lock is under attack by some device or a persistent individual. The security features of the lock 10 are primarily aimed at the defeat of a dialer, and may not be triggered, but the lock needs to be protected from attack by an individual. Thus, if the dialing time exceeds the maximum, then an error is signaled and the lock will not open.

Figure 6:
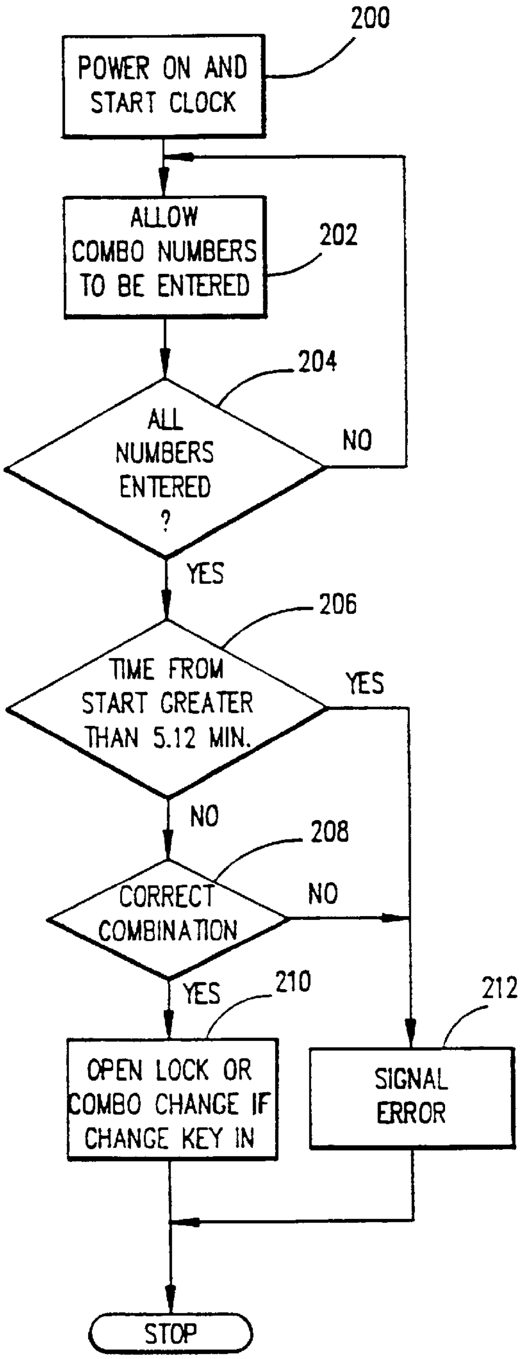
FIG. 6 is a logic flow diagram showing the logic operations that monitor the amount of time that has elapsed for the start of the opening operation with power up to the present, and the control of the lock to prevent the opening of the lock if the time required to enter an valid combination exceeds a predetermined amount of time.

The logic operations for this feature are shown in FIG. 6 which is an expansion of operation 956 of FIG. 18. With operation 200, an elapsed time timer, of the same type as used in the flow diagram of FIG. 5, is started at power-on. The numbers of the combination are then allowed to be entered in operation 202, and after each number is entered, the combination is tested in operation 204 to determine if the last number of the combination has been entered. If the last number has not been entered, the flow loops back to just prior to operation 202 to permit the entry of the next number of the combination.

After the last number of the combination is entered, in operation 202, and the determination of operation 204 is satisfied, the content of the timer is tested to determine if the total time elapsed since power-on has exceeded 5.12 minutes, as an example. If the time period has been greater than 5.12 minutes, the lock electronics 24 signals through the display 18 an error signal, as shown in operation 212 and the lock will not open. The lock is at this point unable to open since there is a signal to prevent the unlocking of the lock 10 and the lock will not open, even with a correct combination, since operation 210 is bypassed. The lock will continue to accept the input of numbers to the lock and will open if the next combination entry is correct. With an entry time exceeding 5.12 minutes there is sufficient delay that an additional time of 90 seconds to power-down the lock is not a significant deterrent.

When the test of the time period elapsed is less than the predetermined time period of 5.12 minutes, for example, the logic flow is directed at operation 206 to operation 208 where the combination is checked for correctness; and, if correct the lock is opened or the combination is changed when the change key 60 is resident in the ports 62 of the microprocessor circuitry in operation 210.

If on the other hand the combination entered is incorrect, the error signal is displayed in operation 212.

Since short times are an advantage to the security of the lock and long periods of operating time are advantageous to the attacker, the advantage to attacker is removed.

MAXIMUM UNATTENDED PERIOD SAFEGUARD FEATURE

A common and serious security violation is to enter the first two numbers of a combination so that the third number may be entered at a later time with a minimum of delay in accessing the enclosure. This practice allows one who knows only the last number of a combination to access the enclosure.

Figure 7:
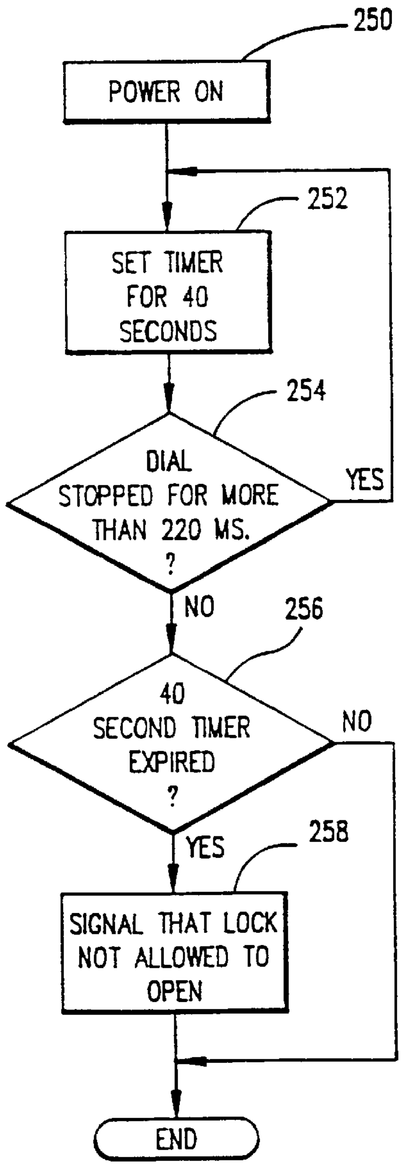
FIG. 7 shows the logic flow diagram representing the logic operations that control the electronics to prevent the total dialing period without a dial stop from exceeding a predetermined time and if so to prevent opening the lock, and to further insure that when the dial is left unturned for a preselected time, the lock will not open without the entry of the entire combination.

The electronic lock disclosed herein has a capability to defeat a partially entered combination and thus return the lock to a scrambled locked condition. FIG. 7 represents the logic flow of the maximum unattended period feature of the lock 10. The feature starts with power-on, in operation 250. As power-on is accomplished, a timer is set to the period of time selected for this feature. A preferred period of time is typically 40 seconds. The microprocessor 44 then checks to see if the dial 14 of the lock 10 has stopped rotating for a period at least a predetermined amount such as 220 milliseconds, by way of example. This period is slightly less than that necessary for the operator to release the knob and regrasp the knob of the dial 14 and start to rotate the dial 14. If the dial has stopped for more than the minimum stop required, the logic loops back to just prior to operation 252 to effectively reset the timer to the predetermined period each time the dial 14 is allowed to remain motionless for the required stop period following a rotation. If the required dial stop period is not met, then the flow of operations is from operation 254 to operation 256 where the unattended timer is polled to see if the period of 40 seconds has expired. If it has expired, the the lock has not been operated within the allotted time and is not allowed to unlock because the electronics 24 have been signalled to not open the lock. This operation is on an interrupt basis and after the operation, the overall system operation continues.

If the timer has not expired, the flow branches from operation 256 around operation 258 and back to the main system operation as the interrupt is completed, at restart entry 862.

This features affect is that if the dial 14 of the lock 10 is not tuned within 40 seconds or if the dial is has not stopped for a period of 220 milliseconds within the 40 second timer period, the numbers of the combination already entered are ignored and are not effective to form part of the combination to unlock the lock. This prevents the operator from entering the first two numbers of the combination and waiting until significantly later to enter the third number of the combination to quickly open the lock 10.

DIAL ROTATION LIMIT

Figure 8:
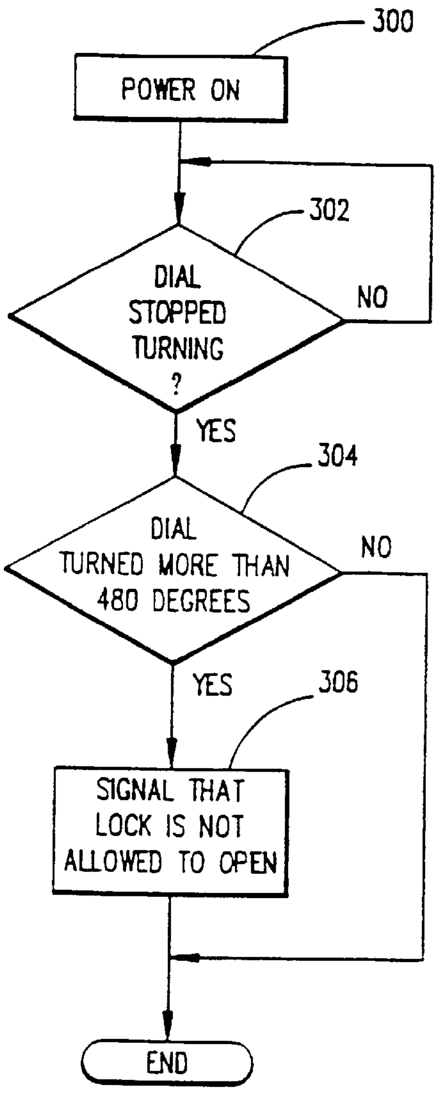
FIG. 8 is a logic flow diagram representing the logic control of the electronic lock to detect whether the dial of the lock has been turned more than than 480 degrees without the dial stopping for a period of more than a predetermined amount.

The use of the human hand to rotate the dial 14 of the lock 10 results in the dial 14 being turned a partial turn and the dial 14 stopped and the hand repositioned to attain a new grasp of the dial 14 prior to the next turn. If the dial turns more than what a normal hand/wrist will permit, the lock typically is being operated by a dialer or similar device. To sense this and to prevent the lock 10 from opening, the amount of dial rotation without a stop is detected. This feature of the invention is illustrated in FIG. 8, which is a more detailed expansion of operation 958 of FIG. 18. After power-on in operation 300, the pulses from the generator 29 are monitored and it is determined whether the dial 14 has stopped turning, in operation 302. If the determination of operation 302 is that the dial has not stopped turning, then the logic control flow loops back to just prior to operation 302 and the pulse output of the generator 29 is again monitored. This loop continues until the dial 14 is detected as having stopped turning. When the dial 14 has stopped the logic flow branches out of the loop to operation 304 where the number of pulses generated since the last dial stop is determined and compared with 160 pulses which is the number of pulses generated by the rotation of the dial 14 by 1.33 turns or 480 degress.

If the dial has rotated more than the predetermined amount of 480 degrees without a stop of the dial the flow is directed to operation 306 where the lock electronics 18 are signaled to not open, even if the correct combination is entered.

As described above, the operation of the lock 10 by a person is not inhibited while the operation of the lock 10 by a dialer or other similar device is severely inhibited because the lock will not respond to the correct combination after the dial is rotated for more than 1.33 turns without stopping. If the dial stops for less than the amount of time necessary for the lock electronics 18 to recognize a dial stop, then the timer is not reset and the lock 10 will at the end of the time period, be rendered unopenable, as in FIG. 7, until the lock powers down and is reset by a new power-on sequence. Thus if a dialer is used and the lock is rendered unopenable, the subsequent inputs by the dialer are not recognized, even if correct, and the enclosure is not openable.

DIAL STOP INITIATED REVERSAL OF NUMBER SEQUENCES

Figure 9:
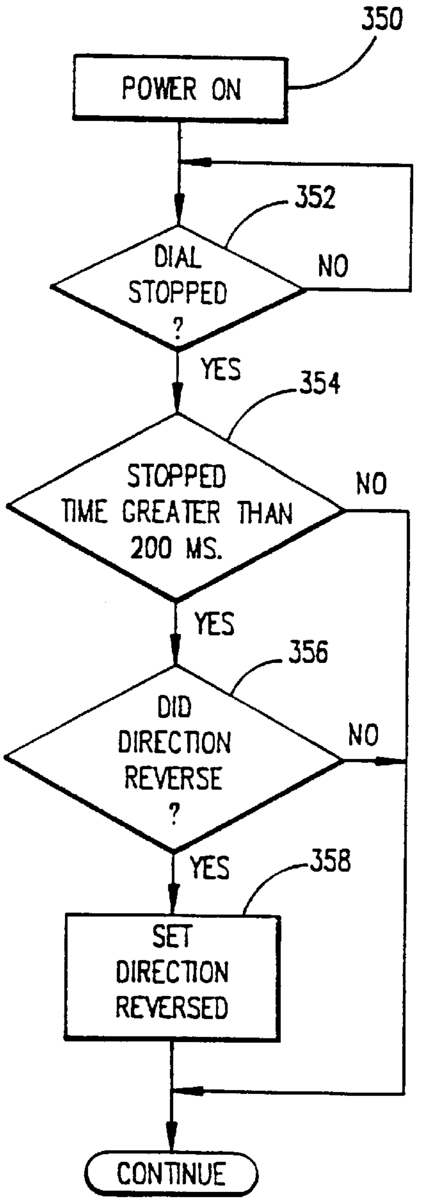
FIG. 9 is a logic flow diagram representing the logic control operations to detect the stopping of the dial and the timing of the stop, and if the stop time is sufficient to recognize dial rotation reversal, then to reverse the direction of the numbers displayed on the display.

The dial 14 must physically stop rotating whenever a number of a combination is reached and the number is entered into the microprocessor 44 as an element of the combination. However the time that the dial 14 is motionless is important since the reversal of the dial 14 of the lock 10 is used to detect that a number is to be entered into the combination element storage locations of the microprocessor 44. If the stop period is too short, microprocessor 44 will not recognize the stop and the rotation of the dial will continue the incrementation of the numbers in the same direction, increasing or decreasing, as was in effect prior to the stop and reversal of the dial. This has the dual effect of further destroying the relation between the dial 14 rotation and the numbers displayed and operated on by the microprocessor 44, and to prevent the entering of the number displayed at the time of the stop. The operation of the logic is illustrated in the flow diagram of FIG. 9.

With power-on, the pulse output of the generator 29 is monitored and a determination made as whether the dial 14 has stopped, in operation 352. If the determination is in the negative the flow loops back to again pass through the decision operation in operation 352 until the result is in the affirmative. At that time the flow branches out of the loop and is directed to operation 354 where the time period is tested as to whether the stopped period exceeds 220 milliseconds, the minimum time period that is necessary to recognise a valid stop condition. If the test in operation 354 is met then the flow is to operation 356, where it is determined whether the dial direction reversed based on pulse polarity. If there was a direction reversal then the direction flag is set reversed from the prior direction. This is accomplished by the setting of a direction flag in the memory of the microprocessor 44.

This flag will also be used by the microprocessor 44 to control display 18 to show an arrow in the appropriate direction.

If the result of operation 354 or operation 356 is in the negative, then the logic flow branches around the operation 358 and leaves the direction uneffected, resulting in any further input pulses from dial 14 rotation changing the numbers displayed in the same direction (increase or decrease) as they were being changed prior to the detecting of a stop of the dial 14 for a time period insufficient to cause reversal recognition. Accordingly, the use of a dialer to attack the lock 10 is again interfered with and defeated.

EXCESSIVE ERROR LOCK OUT

If an attempt to unlock the lock 10 is made and the attempt is unsuccessful, the operator will attempt to unlock the lock 10 again and in all probability will be successful within a very few additional attempts if the operator is in possession of the authorized combination. However, if the operator is not in possession of the authorized combination and is trying the lock in either a systematic or random manner, the microprocessor 44 will keep a count of the incorrect attempts to unlock the lock 10 and if the number of incorrect attempts exceeds a predetermined number of attempts, the lock may be either disabled from further attempts by blanking the display 18 or displaying an error signal to indicate that the combination entered is erroneous, for each subsequent combination, notwithstanding the entry of the correct authorized combination. This safeguard is incorporated in the software microcode contained in the memory of the microprocessor 44 and illustrated in the logic flow diagram in FIG. 10.

Figure 10:
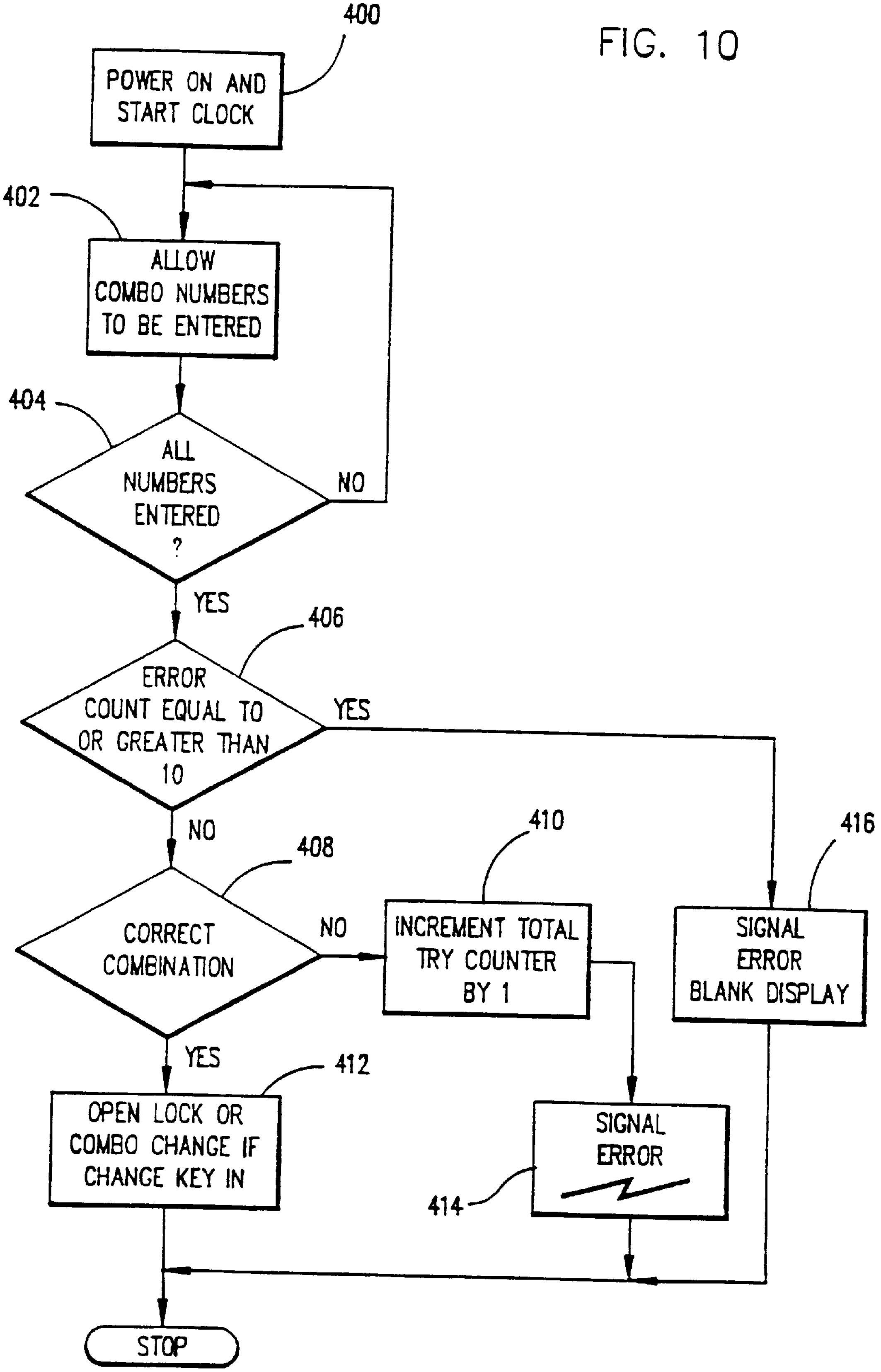
FIG. 10 is a logic flow diagram showing the logic control operations that tabulate the number of times errors occur in attempting to open the lock, and the preventing of the opening of the lock if the number of erroneous attempts exceeds a predetermined number, with the resulting lock out of the opening commands and disabling of the display, if the correct combination is entered.

Referring to FIG. 10, when the lock is powered by the rotation of the dial 14 and generator 29, as represented by operation 400. The numbers of the combination are allowed to be entered into the microprocessor 44 as represented by operation 402.

Thereafter, in operation 404, a check is made as to whether all numbers of the combination have been entered and if the result is negative, the flow branches back to just prior to operation 402, with the acceptance of the remaining numbers of the combination.

The total try count is the number of unsuccessful attempts to open the lock since the last successful attempt to open the lock 10. When the numbers of the combination have been entered, the answer to operation 404 is affirmative and the logic flow branches to operation 406 where the total try count is checked to find its value. In operation 406, the total try count is compared to a predetermined number such as 10 and if greater than or equal to 10, the microprocessor is conditioned to signal an error symbol on the display 18 in operation 415. The LCD display 18 is then interdicted and is blanked to prevent displaying numbers or symbols, thus effectively preventing the entry of any numbers into the lock 10 in an effort to enter the combination.

The lock remains inoperative until it is left unoperated for a period to bleed down the power stored internally. Once the power of the capacitor is bled down, the power to the microprocessor 44 is insufficient to maintain the flags that are set to indicate that the lock 10 is disabled and the lock 10 becomes functional again. The preferred time period necessary for power-down is selected to be sufficiently long to be a source of irritant to an attacker, but not so long as to be a major inconvenience to an authorized operator. A preferred time period for power-down is 90 seconds.

If the total try count is less than 10, for example, then the logic flow is directed by operation 406 to operation 408 where the combination just entered is tested to determine the correctness of the combination.

When the combination is not correct, then the logic flow is branched to operation 410 and the total try count is incremented by one, reflecting the latest unsuccessful attempt to unlock the lock 10. Thereafter the microprocessor 44 is signaled to cause the displaying of an error symbol on the display 18 in operation 414 and then the flow returns to the main logic flow of the system.

Another embodiment would be that the signaling of an error in operation 414, as a result of a Yes result in operation 406, may set a flag in the memory of the microprocessor 44 which can be used by the microprocessor 44 to prevent the opening of the lock 10 even if a correct combination is entered. In this case, operation 415 would not exist. In this mode of operation the display 18 continues to display numbers and symbols as it continues to function, thereby suggesting to the operator that the lock is still working and capable of opening upon the entry of the authorized combination, notwithstanding the fact that the lock is conditioned to refuse to open after the tenth consequtive erroneous attempt to open the lock.

When the combination compares correctly with the authorized combination of the lock 10 in operation 408, the lock 10 is conditioned to open or to change the combination if the change key 60 is inserted into the ports 62 of the microprocessor 44. Thereafter the logic flow stops.

VARIBLE INCREMENTATION OF THE DISPLAY

To further foil and defeat the abilities of a dialer, the lock 10 is provided with a scheme of varying the number of pulses of the generator 29 that are required to update the display 18 to cause it to display the next smaller or larger number. The benefit of this scheme is as the speed of rotation of the dial 14 of the lock 10 increases, the rate of change of the displayed numerals increases until the rate of change is set by the fastest rotational rate and then the relationship of the rate of change of the displayed numbers to the number of pulses from the generator remains constant for the remainder of that rotational movement of the dial 14, until the dial stops, even if the rotational speed of the dial slows during later stages of rotation. The effect is to reduce the correlation of the number change rate on the display 18 and the extent of rotation of the dial 14.

Figure 12:
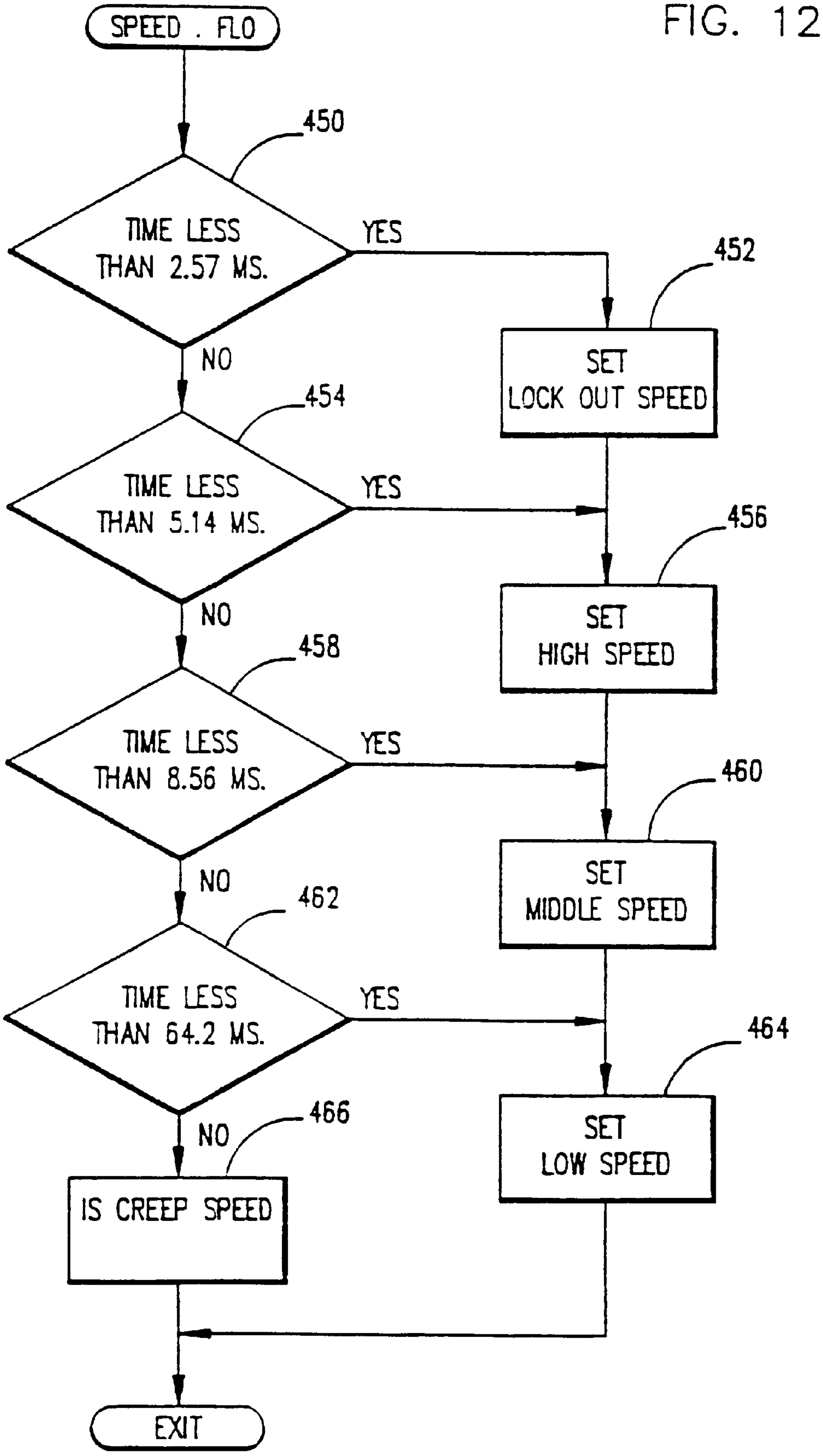

FIG. 12 is a flow diagram which represents the decisions made by the microprocessor 44 to determine the speed at which the dial 14 is being turned, which is then used to set rates at which the the numbers are changed. Returning to FIG. 2, the generator 29 outputs pulses on lines 38 and 40 which are out of phase. The out-of-phase relation is used to determine the direction of rotation of the dial 14 and the magnetic portion 28 of the generator 29. The phase 1 line 38 conveys pulses which are used to indicate rotational displacement of the dial 14. The generator 29 is configured such that a full rotation of the dial will cause the generator 29 to create 120 pulses.

The pulses on the phase 1 line 38 are connected to an interrupt bit in the microprocessor 44. Accordingly, each pulse interrupts the microprocessor 44. The interrupts are used to start and stop timers and counters.

Dial reversal is detected when seven phase 1 pulses are detected and the polarity of at least 6 of the phase 2 pulses are of the same polarity. Thus when the dial is reversed, the polarity of the first phase 2 pulse to be received has been preceeded by six phase 2 pulses of the prior polarity. As each succeeding phase 2 pulse is received the count of phase 2 pulses of the new polarity increases until when the sixth phase 2 pulse of the new polarity is detected, the voting scheme is satisfied and the new direction of rotation is determined.

The microprocessor 44 times the interval between the phase 1 pulses and thereby detects the rotational speed of the dial 14. The speed is not sampled until after seven phase 1 pulses have been received, to avoid speed detection when the dial 14 is not being turned enough to provide a reliable input. After seven pulses have been received the six interpulse times are culled by discarding the shortest and the longest and the mean of the remaining times determined and used. This approach to filtering of values acts to filter out noise.

As each speed criteria is met in ascending order of speed, that speed indicator is set andretained for the remainder of the dial turn; while the speed indicator is not reduced if the dial slows down during that dial turn, the speed indicator may be increased as speed increases.

A further filter to eliminate spurious conditions which could lead to unreliable results is that the middle and high speed indicators in the microprocessor 44 are locked out or rendered ineffective unless at least 10 phase 1 pulses have been detected by the microprocessor 44 since the last valid dial stop. This filtering of the inputs insures that the middle and high speed operation of the display 18 is prevented during quick short burst turns of the dial 10.

The Microprocessor 44 has within it a counter that is designated as the combination counter, which counts the numbers and the numbers are displayed on display 18, as well as being available for the internal processing of the number for use in the combination. The combination counter is incremented/decremented, based on the number of pulses received by the microprocessor 44. The number of pulses necessary vary based on the dial speed as decided by the voting scheme described above.

The preferred and exemplary conditions for changing the combination counter are presented tabularly below.

| | SPEED CHART | |
|---|---|---|
| SPEED FLAG | TIME INTERVAL BETWEEN PULSES MINIMUM | PULSES PER COMBINATION COUNT |
| Lock out | 2.57 msec | 2 |
| High | 5.14 msec | 2 |
| Middle | 8.56 msec | 5 |
| Low | 64.2 msec | 3–13 |
| Creep | 220 msec | 3–13. |

As can be seen from the table, the counter and the display is incremented by one unit for each five pulses if the interpulse time interval is less that 8.56 msec but more than 5.14 msec and the middle speed flag is set.

The lock out flag is set only during the actual opening cycle of the lock 10 (turning the dial 14 to retract the bolt 26 from strike 56), to inhibit the bolt 26 from being retracted if the dial 14 is turned too fast. If the bolt 26 is engaged with the bolt retracter 50 when the dial is being turned too fast, physical damage to the lock mechanism may result.

The incrementing of the combination counter is accomplished for the first three pulses of a turn in the low or creep speed and then thereafter with each 13 pulses. This is to provide the operator a visual feedback early in the operation at these speeds and then to slow the incrementing to the desired rate thereafter, for the same dial turn.

In the high speed mode or operation, all numbers are sent to the display 18. Due to the response time of the display and the ability of the human eye to receive and process images only at relatively slow speeds, it may appear that numbers are being skipped by the display 18.

For a better understanding of the logic operations necessary to control the speed of the change of the combination counter and display 18, reference is made to FIG. 12. As the interpulse time period is determined by the detection and voting scheme described above, the time value is compared in operation 450 to the time interval standard for the lock out mode, i.e., 2.57 msec, and if the interpulse time is less than the standard, the lock out speed flag is set in operation 452. If the time period is greater than the lock out speed mode time standard, the flow is from operation 450 to operation 454 where the interpulse time period is compared with the high speed time standard of 5.14 msec and if the time interval is less than the high speed time standard the flow branches to operation 456 where the high speed flag is set. Similarly, the interpulse time period is compared to the middle speed time standard and the slow speed time standard and the appropriate speed flags set.

The setting of a speed flag results when the flow is diverted from the series of decision operations 450, 454, 458 and 462. The flow is then thru flag setting operations 452, 456, 460 and 464 as appropriate with the resulting setting of all flags for speeds slower that the first satisfied speed condition.

Referring to operation 462, if the interpulse time interval is greater than 64.2 msec, then the only remaining choice of speeds is that of creep speed and the creep speed flag is set in operation 466. The flow from operation 464 or 466 is back to the main flow of the system.

As the dial 14 is turned the microprocessor 44 not only receives the pulses but after determining the speed at which the dial 14 is turning, then must update or increment the combination counter. This is accomplished by the logic control operations represented by the flow diagram of FIG. 13.

As the pulse flow into the microprocessor 44 continues the the flags of the microprocessor 44 are checked to ascertain if the direction has been determined by the voting scheme as described above. This decision as to whether the direction has been decided is represented by operation 500. If the decision on the direction of the dial 14 rotation has not been made, it is premature to assess speed. This is not done until direction has been determined, and the flow branches around all other operations of the subroutine and returns to the main flow of the system.

If, on the other hand, the direction has been determined, the flow from operation 500 is to operation 502 where the high speed flag is checked. If the high speed flag is set, the microprocessor 44 is commanded to update the combination counter by one unit for each two pulses received from the generator 29, as represented by operation 504.

If the high speed flag has not been set then the middle speed flag is tested to see if it has been set in operation 506. When the middle speed flag has been set, as determined in operation 506, the combination counter is updated by one unit for each five pulses as represented by operation 508.

Similarly, if the flag for the middle speed is not set, a decision in operation 510, is made as to whether this is the initial dial rotation at a low speed in this dial turn. If this decision operation results in a negative determination, then the dial 14 has been rotated at a low speed previously in this dial turn and the combination counter is incremented by one unit for each 13 pulses generated by the generator 29, as represented by operation 512.

When the result of operation 510 is in the affirmative, the flow is to operation 514 where the combination counter is updated by one unit for each 3 pulses received by the microprocessor 44.

Following the updating of the combination counter, in response to any of the speed flags set or not set, the control reverts back to the main logic control of the lock 10.

BACKUP FEATURE

The backup feature is important in that it gives the operator a way to recover from an erroneously dialed number if the number has not been entered and if the dialed number is less than 3 from target number. The feature does not compromise the security of the lock since the operation of the lock is to back up the number by four units upon any dial reversal. Thus, the backing up of the displayed numbers on the display 18 does not indicate to the attacker that he has approached a combination number, since any reversal of the dial at any number will result in the four unit backup of the displayed number. Progressing past the backed up value and continuing the reversal movement enters the value of the number in the combination counter and on the display 18 when the reversal occurred, as a combination number for later comparison. The backup feature is operational on all dial reversals.

Figure 11:
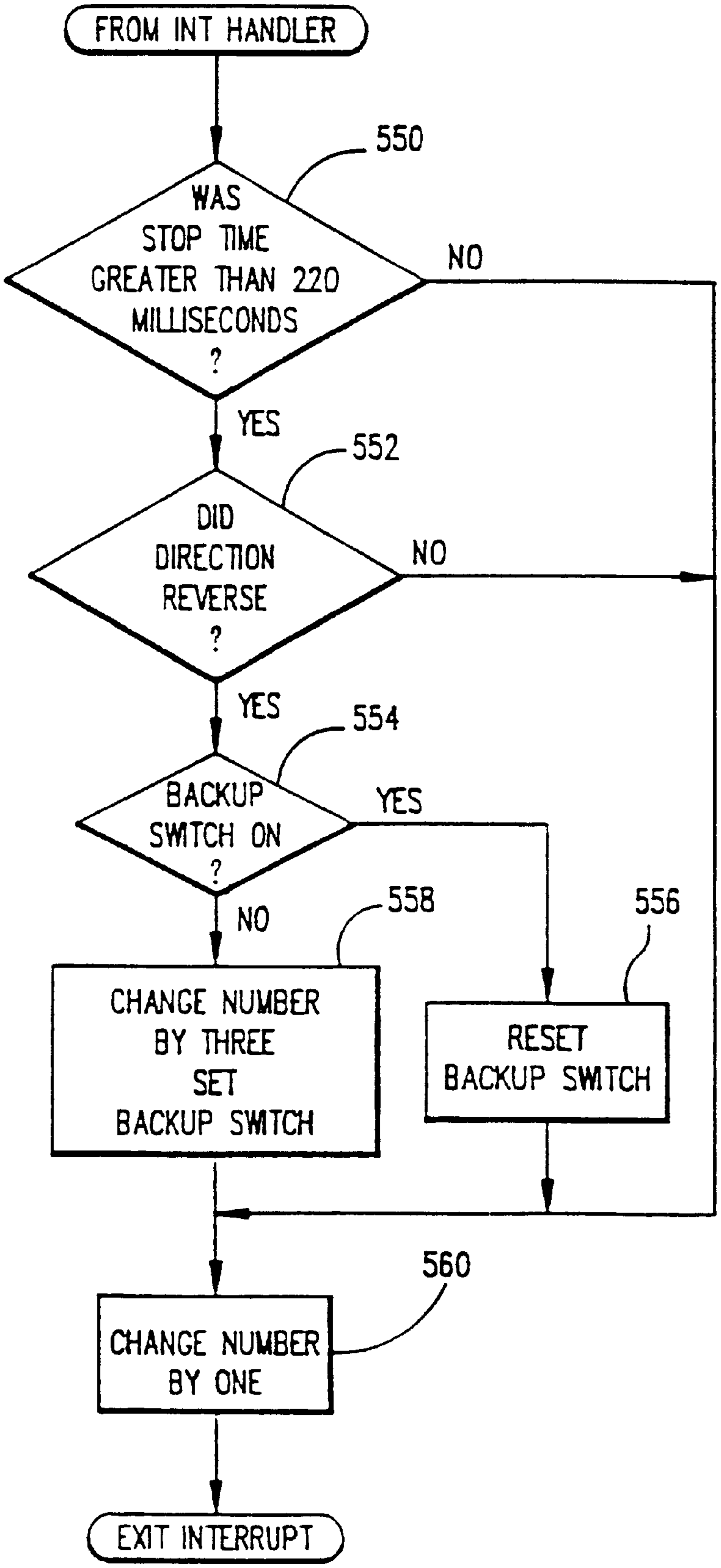
FIG. 11 is a logic flow diagram that shows the logic control operations to permit the recovery from a condition where the number displayed is past the target number by less than 3 and allows the operator to reverse the display sequence and return to a number that is four units prior to the displayed number and to approach the target number again.

When dialing the combination, the operator may turn the dial 14 too far and pass the target number of the combination. While the dial may be turned additional revolutions and the target number selected and displayed, the preferred embodiment of the lock is to permit the operator to reverse the dial direction for a short displacement with the numbers displayed and contained in the combination counter changed to a number four units displaced for the number displayed prior to backing up. After the numbers have backed up by four units, the dial 14 may then be turned in the direction that it was originally being turned, to again approach the target number of the combination. The logic control of this function is illustrated in FIG. 11.

When a number has been dialed and the dial 14 is stopped, the period of the stop is checked to determine if the stop time is at least 220 msec in operation 550; and if not, the stop is not recognized and the flow branches around other operations in the subroutine to operation 560, where the combination counter and the display 18 are changed by one unit.

On the other hand, if the stop time does exceed 220 msec then the stop is recognized as a valid dial stop, and the flow is directed to operation 552 where a decision is made as to whether the dial reversed direction. If there is no reversal of direction, there is no need to consider the backing of the displayed numbers and the contents of the combination counter. Accordingly, the branch is to operation 560, as described above, and there is no effort to reverse the count and the further rotation is an attempt to reach a number as yet not accessed.

If the direction of the dial 14 rotation is reversed, then a flag called the backup switch is checked to ascertain if it is turned on. If this backup switch is on in operation 554, it indicates that the backup process is underway and the latest reversal of the dial 14 is preparatory to the resumption of the operation of the dial 14 to dial the target number of the combination. In this instance, there is-no need to backup the numbers and, accordingly, the backup switch is reset in operation 556, prior to changing the number on the display 18 and in the combination counter by one, at operation 560.

When the status of the backup switch is tested in operation 554, if the status is off, then the flow is to operation 558. In operation 558, the number is changed by 3 and the backup switch is set. The finding in operation 554 that the backup switch was not on indicates that the dial 14 was turned but had not previously been reverse rotated; therefore, the reversal of the dial 14 should invoke the backing-up of the numbers.

Thereafter, the flow from operations 556 or 558 is to operation 560 where the number is changed by one unit. The net effect is that the numbers displayed are changed by 4.

ERROR AND SEAL COUNTERS

Referring to FIG. 15, the operation of the seal and error counters and the display of their contents will be described.

When the lock 10 is powered on, in operation 600, the clockwise rotation of the dial 14 is checked for, at operation 602. If the rotation of the dial 14 is counter-clockwise, then the flow is branched around other operations to operation 608. However, if the rotation is clockwise, the flow is to operation 604 where the seal counter contents are displayed on the dial 18. The seal counter counts the number of times that the lock has been opened sucessfully.

After the contents of the seal counter have been displayed on the display 18, if there is a clockwise turn of the dial 14, the logic control flow branches and loops back to just prior to the display operation 604. When the rotation of the dial 14 is counter-clockwise, as detected in operation 606, the error counter is checked to ascertain if the value stored therein is three or more, in operation 608. If the value in the error counter is three or larger, then the error counter contents are displayed in operation 610. The displayed number is the count of times that the lock 10 has been dialed for access without successfully opening it or when one of the security features has blocked the lock 10 from opening. The count is from the last successful opening of the lock 10.

Two turns in the counter-clockwise direction will result in the continued display of the error counter contents, as illustrated in operation 612. Two turns in the clockwise direction will branch to operation 614 where the combination for the lock is allowed to be entered.

After entry of the combination, operation 616 does a compare of the entered combination and the authorized combination and if they compare true, the lock is conditioned to unlock in operation 618.

Since the error counter only accumulates the count of erroneous entry attempts since the last successful opening of the lock 10, with the compare true on the combination, the error counter is reset as in operation 620. Similarly, the seal counter counts successful combination entries, and the seal counter is updated by incrementing its contents by one unit, as in operation 622.

Should the combination not compare true in operation 616, the error counter is incremented one unit in operation 624 to reflect the erroneous entry attempt. After the incrementing of the seal or error counters, the routine ends and the lock awaits any further input by the operator. As discussed earlier, if left unattended for a sufficient amount of time, the lock will power down.

The combination of the error and seal counters provide a reliable, easily accessed, easily understood indication that the lock has been operated; and if the numbers are different, indicate either failure or success by the attacker.

LOST COMBINATION RESETTING

The serial number of the lock may be used as a temporary combination to open the lock and thus allow the setting of a new combination. This allows for circumstances where locks are placed in inventory and records of combinations are misplaced or memories lapse and no one remembers the combination of an inventory lock.

Figure 14:
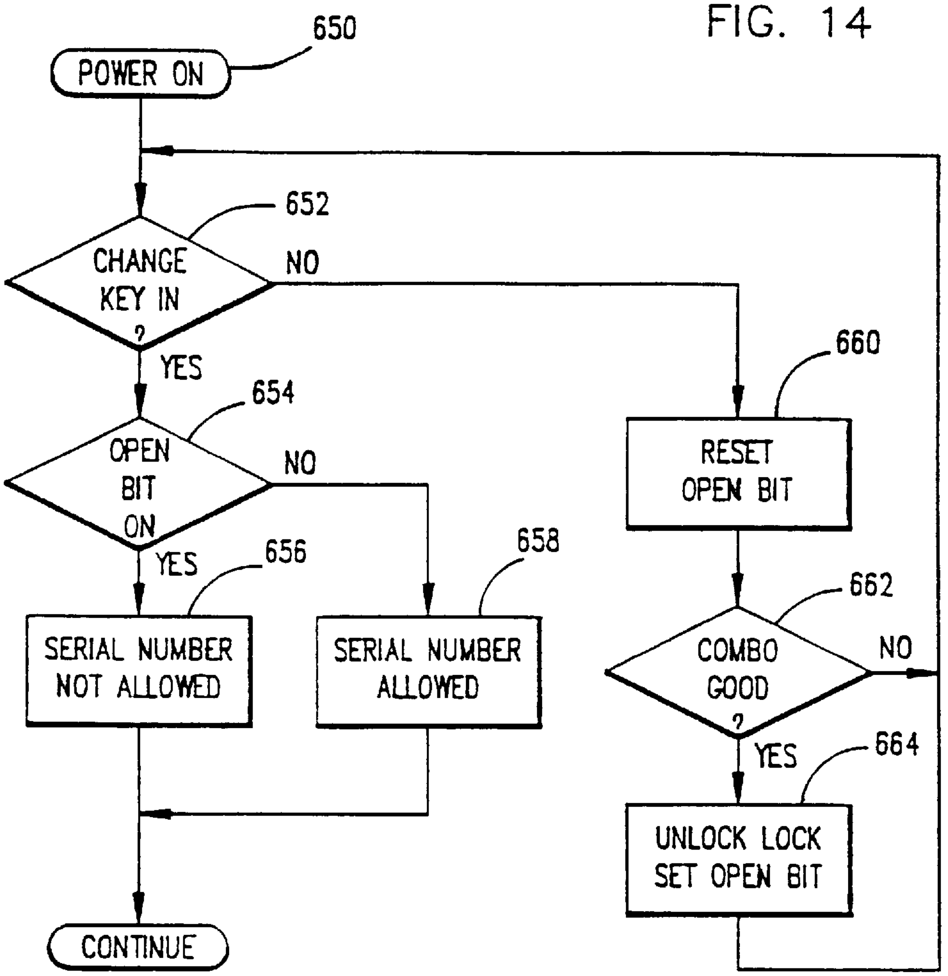
FIG. 14 is a logic flow diagram illustrating the feature where the serial number of a lock is used to operate the lock, under some circumstances.

Referring to FIG. 14, to open the lock so that the normal change combination procedure may then be used, the change key 60 is inserted in the lock 10. The lock 10, when powered on, operation 650, will detect the presence of the change key 60 in ports 62 of the microprocessor 44, in operation 652.

If the change key 60 is detected, the open flag in the memory of the microprocessor 44 is checked in operation 654. If the open flag is on, the serial number is not allowed by operation 656 as a combination, because the lock is open and was presumably opened with a correct and known combination. However if the open flag or bit is not on, indicating that the lock 10 is locked, then the lock 10 is conditioned to accept the serial number of the lock 10 as a substitute combination, in operation 658. This may be accomplished by the setting of a flag which then allows the comparing of the serial number which is stored in a memory associated with microprocessor 44, with the entered combination, rather than comparing the authorized combination.

When the change key 60 is not in the lock 10, as ascertained in operation 652, the open bit is reset in operation 660, and the combination entered is compared with the authorized combination in operation 662; if good, the lock is unlocked and the open bit is set in operation 664. If the combination is not good the logic flow branches back to the beginning of the routine to await further input.

This scheme does not compromise the security of the lock since the lock must be accessible for the insertion of the change key while the lock is locked, i.e., when the combination is scrambled and the open bit is reset. This prevents the covert insertion of the change key 60 when a safe or vault is open and the return at a later time to open the safe or vault 12 with the combination that might be changed using the serial number of the lock.

The insertion of the change key 60 into the ports 62 creates a condition that prevents the resetting of the open bit. As seen from operations 654 and 658, the open bit must be reset for the serial number to be allowed in lieu of the authorized combination in the combination change procedure.

LOCK DISABLEMENT AND RECOVERY

Figure 22:
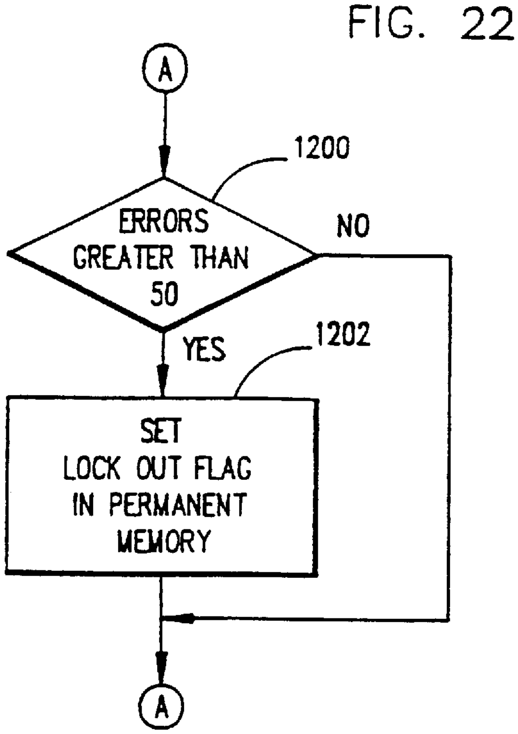
FIGS. 22 and 23 illustrate alternative embodiments of the feature causing the lock to not open after a predetermined number of consecutive erroneous attempts, in logic flow form.

Referring to FIG. 22, there is shown a feature in logic form, where if the error counter is incremented to a number larger than that concieveably needed for an individual with an authorized combination to operate the lock, such as 50 times the lock can be disabled. To accomplish this a check of the error counter is done in operation 1200, where the error count is compared to the number, for example 50. If the number is not greater than 50 the flow would return. However, if the number is greater than 50 the lock out flag is set in permanent memory at operation 1202 and then return. This flow could, if desired, be inserted in the flow of FIG. 18, between operations 868 and 952 at A.

Figure 23:
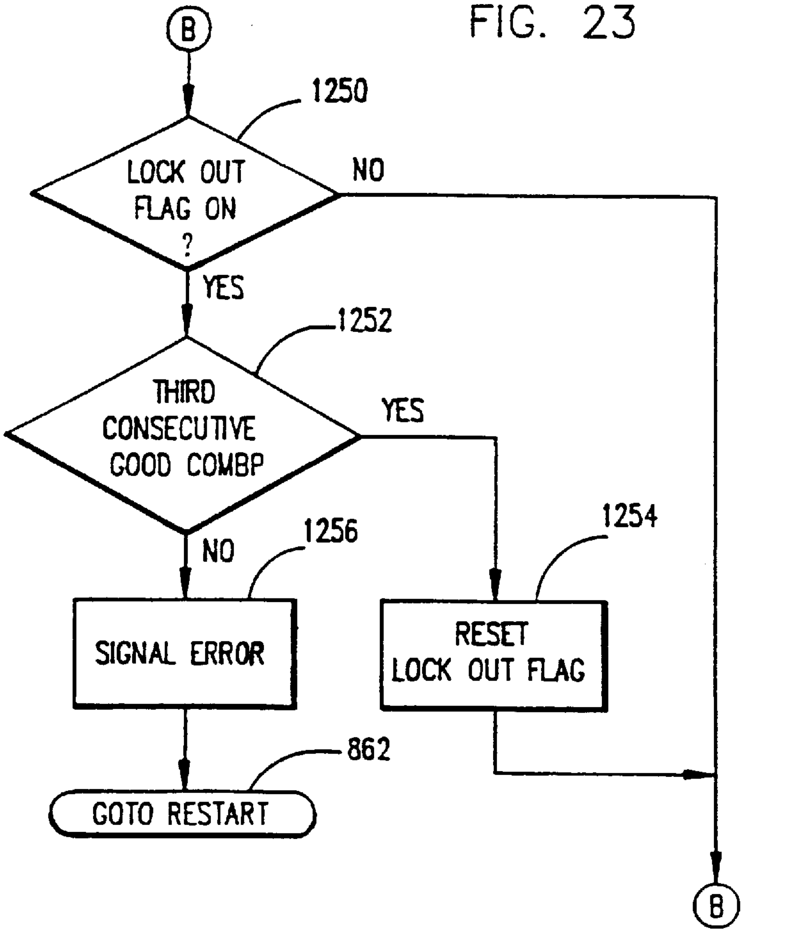

Once the lock out flag is provided and the flow in FIG. 22 is incorporated into the flow of FIG. 18, the flow of FIG. 23 may be inserted into the routine shown in FIG. 18, between operations 958 and 962, at B.

If this embodiment is incorporated into the flow of FIG. 18, then when the decision in operation 958 is negative, the lockout flag is checked in operation 1250 and if not ON, the flow returns to B and continues. However, if the lock out flag is ON the microprocessor checks to see if the combination entered is the third consecutive correct combination entry in operation 1252. If so, the lock out flag is reset at operation 1254 and the flow is to return at B. If the combination is not the third consecutive correct combination entry, an error is signaled in operation 1256, the same as described in operation 960 of FIG. 18, and the flow is to restart entry 862, FIG. 3.

If desired, operations 1252 and 1254 may be omitted from the flow of FIG. 23. When this occurrs, the lock cannot be reset and the lock must be drilled and replaced, since the flow of FIG. 23, without operations 1252 and 1254 results in the lock being permanently disabled with no way of recovery.

The foregoing routines that implement the functions and features operate within the system operations of the lock as is represented in FIG. 3 and the Figures referred to from FIG. 3.

The preferred embodiment of this invention is to implement all the control operations and hence the functions and operational features of the lock 10 in microcode in a microprocesser 44 of the type sold by OKI Electric Industries Company, Ltd., under the designation 80C51F. Other microprocessors by other manufacturers may be substituted for the preferred device so long as the characteristics of the substituted device meet the needs of the lock 10.

The control of the microprocessor 44 is by microcode which is written according to the constraints defined by the device manufacturer and which are readily available from the device manufacturer of choice. Any skilled code writer may code the microcode, given a program listing. The program listing may be prepared for the the device of choice, following the constraints required by the particular microprocessor device chosen. The logic and operational flow diagrams contained in FIGS. 3–23 are applicable to any microprocessor and accordingly, teach one of skill in programming the necessary operations to operate the lock. The organization of the logic flows is exemplary and may be modified according to the desires of the programmer and code writer.

The foregoing is the preferred embodiment of the invention. It is recognized that changes and modifications may be made to the embodiment of the invention without departing from the scope and the spirit of the invention and such changes and modifications reside within the scope of the claims below:

We claim:

1. An electronic combination lock comprising a dial means for inputting combination elements;

generator means driven by said dial means for powering said electronic lock and for converting said inputting of said combination elements into electical pulses;

microprocessor means for receiving said pulses and for utilizing said pulses received to control the operation of said microprocessor;

display means for displaying to an operator numbers to be incremented and decremented to enter numerical elements of the combination into the lock;

said microprocessor further comprising means for generating a random number between predetermined numerical limits as the starting point for said lock to receive inputs for entering of a numerical element of a combination.

2. The electronic combination lock of claim 1 wherein said microprocessor further comprises means for controlling said display means to display said random number as the first number in a sequence of numbers displayed by said display means, as said dial means is rotated to change said displayed number and select a number for entry into said microprocessor as an element of said combination.

3. An electronic combination lock comprising:

a combination input member for inputting a combination code including a plurality of combination number inputs, an electronic display electrically coupled with the combination input member to display numbers including said combination number inputs, a lock mechanism operable between locked and unlocked conditions, and a control electrically connected to said combination input member and operatively coupled with said lock mechanism for changing the lock mechanism to the unlocked condition upon input of the combination code, said control including a number selector which selects an input starting number from a set of input starting numbers for use after a first one of said combination number inputs has been entered, wherein said control changes said display to show said input starting number at the start of a second one of said combination number inputs.

4. An electronic combination lock comprising:

a rotatable combination dial for inputting a combination code including a plurality of combination number inputs, an electronic display to display numbers including said plurality of combination number inputs as the dial is rotated, a lock mechanism operable between locked and unlocked conditions, and a control electrically connected to said combination dial and to said lock mechanism for changing the lock mechanism to the unlocked condition upon input of the combination code, said control configured to accept a desired combination number input after the combination dial stops rotating and said control including a number selector which selects an input starting number from a set of starting numbers for use after a first one of said combination number inputs has been entered.

5. The electronic combination lock of claim 4, wherein the control is configured to automatically accept said desired combination number input after the combination dial remains motionless for a sufficient amount of time.

6. A method of operating an electronic combination lock having a display, a combination dial, and a control which defines an angle of rotation between two desired numbers in a combination code, the method comprising;

rotating said combination dial, stopping the combination dial to show one of said desired numbers in said display, entering said desired number as part of said combination code, and rotating the combination dial to the other desired number in said combination code by rotating the dial through an angle which does not correspond to the angle of rotation between said desired numbers.

7. The method of claim 6 further comprising:

showing a different number in said display than said one desired number during the step of stopping said combination dial.

8. The method of claim 7, wherein the step of showing a different number in said display further includes choosing a number from a predetermined set of numbers.

9. The method of claim 8, wherein said predetermined set of numbers includes a plurality of numbers selected from the set of 0 to 99.

10. An electronic combination lock, comprising:

an input component for receiving elements of a combination code;

a lockable member operable between locked and unlocked positions; and electronic circuitry configured to compare a combination of code elements received from said input component with a prescribed combination of code elements, and in response control an operation of said lockable member;

said electronic circuitry being further configured to produce a signal corresponding to a random number between predetermined numerical limits as the starting point for a numerical element of a combination code entered at said input component.

11. The electronic combination lock of claim 10, including:

a display unit for displaying numbers being incremented or decremented as elements of the combination code entered at said input component.

12. The electronic combination lock of claim 11, wherein said electronic circuitry is further configured to control said display unit to display said random number as the first number in a sequence of numbers to be displayed by said display unit, as said input component is operated to change said displayed number and select a number for entry to said circuitry as an element of said combination code.

13. The electronic combination lock of claim 10, wherein said input component comprises a rotary dial.

14. The electronic combination lock of claim 10, including a conversion component for converting said code elements into corresponding electrical signals.

15. The electronic combination lock of claim 14, wherein said conversion component comprises an electricity generator for producing electrical pulses corresponding to said code elements.

16. The electronic combination lock of claim 10, wherein said input component comprises a rotary dial, and said conversion component comprises an electricity generator for producing pulses as said dial is rotated.

17. The electronic combination lock of claim 10, wherein said electronic circuitry comprises a microprocessor.

18. The electronic combination lock of claim 17, wherein said electronic circuitry further comprises a random number generator.

19. The electronic combination lock of claim 13, wherein said electronic circuitry is further configured to control said display unit to display said random number as the first number in a sequence of numbers to be displayed by said display unit as said dial is rotated to change said displayed number and select a number for entry to said circuitry as an element of said combination code.

20. The electronic combination lock of claim 10, wherein said lockable member comprises a bolt.

21. The electronic combination lock of claim 10, including an electricity generator coupled to said input component for powering said lock.

22. The electronic combination lock of claim 13, including an electricity generator coupled to said dial for powering said lock.

* * * * *

UNITED STATES PATENT AND TRADEMARK OFFICE

CERTIFICATE OF CORRECTION

PATENT NO. : 5,973,624

DATED : October 26, 1999

INVENTOR(S) : J. Clayton Miller et al.

It is certified that error appears in the above-identified patent and that said Letters Patent is hereby corrected as shown below:

Column 1, line 41, change "need" to --needed--.

Column 1, line 63, delete the second occurrence of "the".

Column 5, line 1, change "penatrating" to --penetrating--.

Column 5, line 14, change "lick" to --lock--.

Column 5, line 19, change the second occurrence of "of" to --to--.

Column 5, line 31, delete "a".

Column 5, line 39, after "is" insert --to--.

Column 6, line 18, change "an" to --a--.

Column 7, line 27, after "may" insert --be--.

Column 8, line 59, delete the first occurrence of "operation".

UNITED STATES PATENT AND TRADEMARK OFFICE

CERTIFICATE OF CORRECTION

PATENT NO. : 5,973,624

DATED : October 26, 1999

INVENTOR(S) : J. Clayton Miller et al.

It is certified that error appears in the above-identified patent and that said Letters Patent is hereby corrected as shown below:

Column 9, line 18, change "rentry" to --reentry--.

Column 9, line 46, change "of" to --if--.

Column 10, line 8, change "that" to --than--.

Column 10, line 29, change "is" to --in--.

Column 10, line 59, delete the first occurrence of "the".

Column 10, line 63, delete the first occurrence of "the".

Column 11, line 38, delete the first occurrence of "the".

Column 11, line 43, delete the first occurrence of "the".

Column 11, line 50, change "combinations (s) to --combination(s)--.

Column 13, line 32, change "directin" to --direction-- and "facits" to --facets--.

Column 13, line 42, change "surrepticious" to --surreptitious--.

Column 15, line 58, delete the first occurrence of "the".

Column 16, line 2, change "tuned" to --turned--.

Column 16, line 2, delete "is".

Column 16, line 34, change "degress" to --degrees--.

UNITED STATES PATENT AND TRADEMARK OFFICE
CERTIFICATE OF CORRECTION

PATENT NO. : 5,973,624

DATED : October 26, 1999

INVENTOR(S) : J. Clayton Miller et al.

It is certified that error appears in the above-identified patent and that said Letters Patent is hereby corrected as shown below:

Column 17, line 16, change "recognise" to --recognize--.

Column 18, line 47, change "consequtive" to --consecutive--.

Column 19, line 43, change andretained" to --and retained--.

Column 20, line 55, change "that" to --than--.

Column 21, line 2, delete the first occurrence of "the".

Column 24, line 9, change "concieveably" to --conceivably--.

Signed and Sealed this

Seventeenth Day of April, 2001

*Attest:*

NICHOLAS P. GODICI

*Attesting Officer* *Acting Director of the United States Patent and Trademark Office*